(12) United States Patent
Takashima

(10) Patent No.: US 9,263,458 B2
(45) Date of Patent: Feb. 16, 2016

(54) NON-VOLATILE MEMORY HAVING CHARGE STORAGE LAYER AND CONTROL GATE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 796 days.

(21) Appl. No.: 13/422,404

(22) Filed: Mar. 16, 2012

(65) Prior Publication Data

US 2012/0241837 A1    Sep. 27, 2012

(30) Foreign Application Priority Data

Mar. 23, 2011    (JP) ................... 2011-064932

(51) Int. Cl.
| | | |
|---|---|---|
| H01L 27/105 | (2006.01) | |
| H01L 27/115 | (2006.01) | |
| G11C 11/56 | (2006.01) | |
| G11C 16/04 | (2006.01) | |

(52) U.S. Cl.
CPC ...... *H01L 27/11524* (2013.01); *G11C 11/5621* (2013.01); *G11C 16/0483* (2013.01)

(58) Field of Classification Search
USPC ........ 365/185.01, 185.17; 257/314–316, 320, 257/368, 510
See application file for complete search history.

(56) References Cited

U.S. PATENT DOCUMENTS

| | | | |
|---|---|---|---|
| 7,682,900 B2* | 3/2010 | Kim et al. ................ | 438/257 |
| 7,868,376 B2* | 1/2011 | Aoyama et al. ............. | 257/324 |
| 2005/0157549 A1* | 7/2005 | Mokhlesi ............. | H01L 27/115 365/185.01 |
| 2007/0184615 A1* | 8/2007 | Brazzelli et al. ............. | 438/266 |
| 2008/0217674 A1* | 9/2008 | Watanabe ......... | H01L 21/28273 257/316 |
| 2012/0049266 A1* | 3/2012 | Oh et al. ................... | 257/316 |

OTHER PUBLICATIONS

Prall, K. et al., 25nm 64Gb MLC NAND Technology and Scaling Challenges, IEDM, 2010, pp. 102-106.
Background Art Information in one page dated Oct. 27, 2011.

* cited by examiner

*Primary Examiner* — Bradley K Smith
*Assistant Examiner* — David Goodwin
(74) *Attorney, Agent, or Firm* — Knobbe, Martens, Olson & Bear, LLP

(57) ABSTRACT

According to one embodiment, a non-volatile memory includes a first non-volatile memory cell and a first selected transistor. A first cell block is formed by connecting a plurality of first non-volatile memory cells in series. An area S1 of the first insulating film at which the first floating gate is in contact with the first silicon channel is larger than an area S2 of the second insulating film at which the first floating gate is in contact with the first gate electrode.

18 Claims, 23 Drawing Sheets

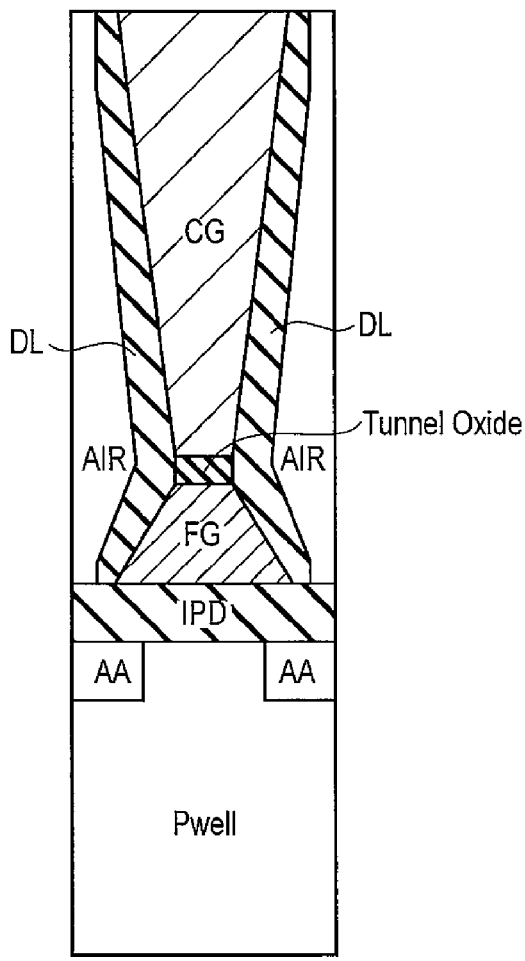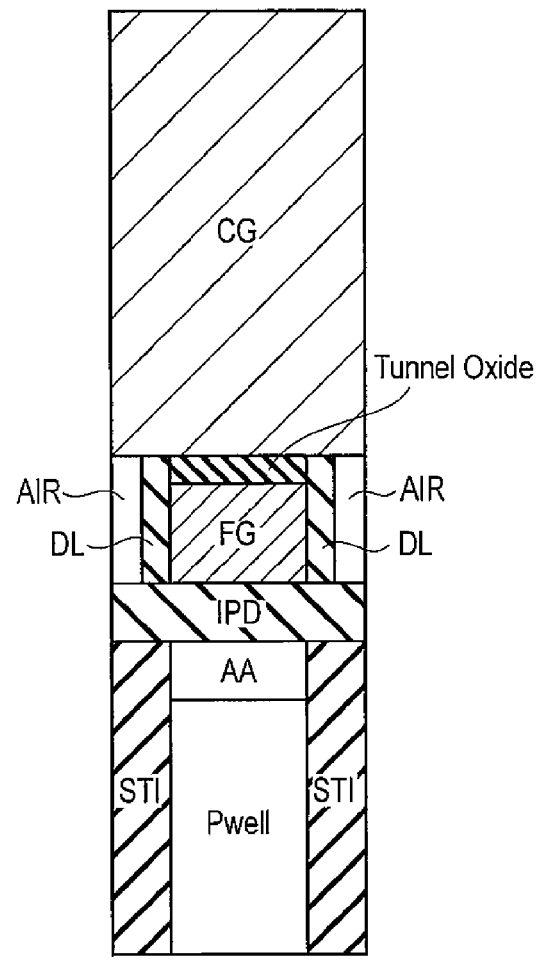
F I G. 1A    F I G. 1B

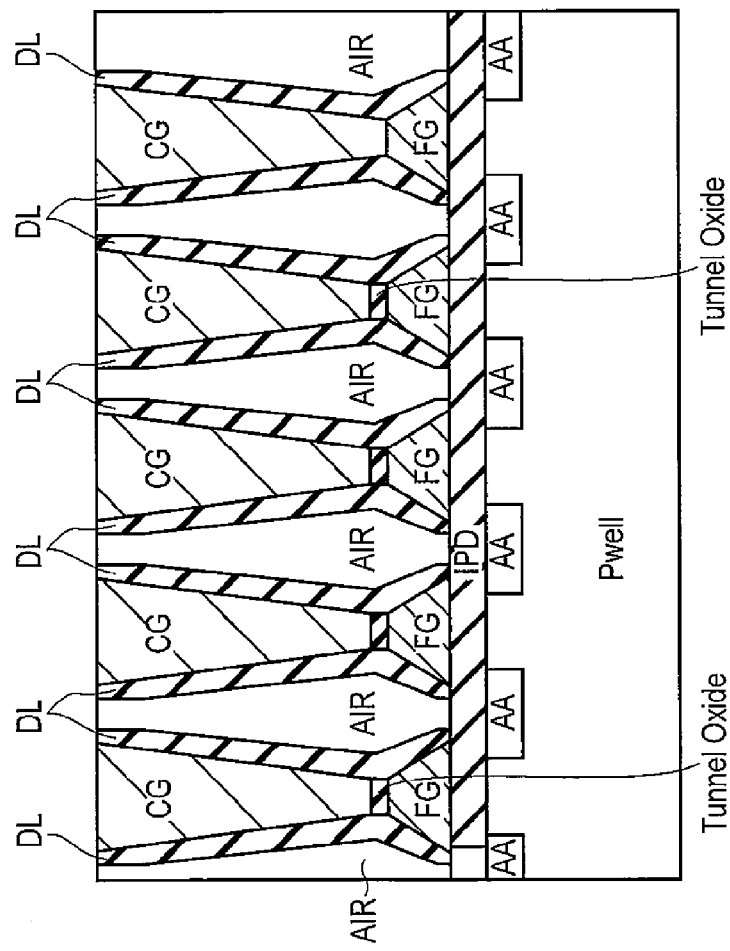
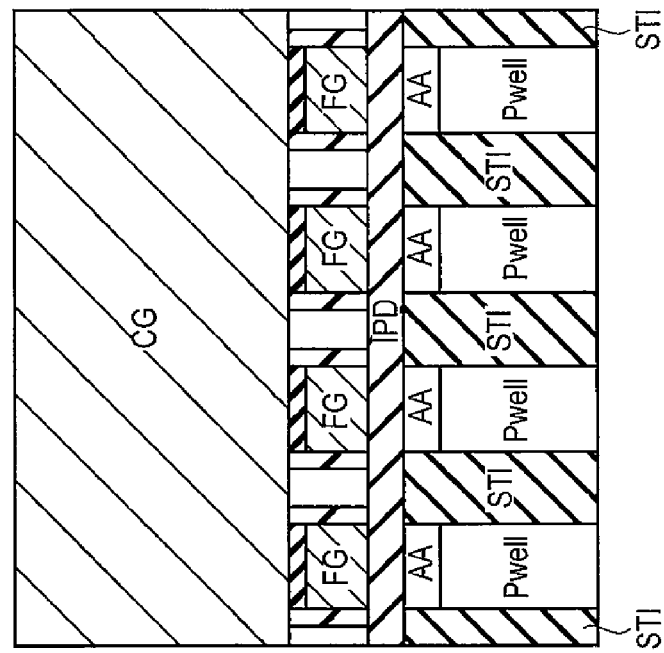
FIG. 2A
FIG. 2B

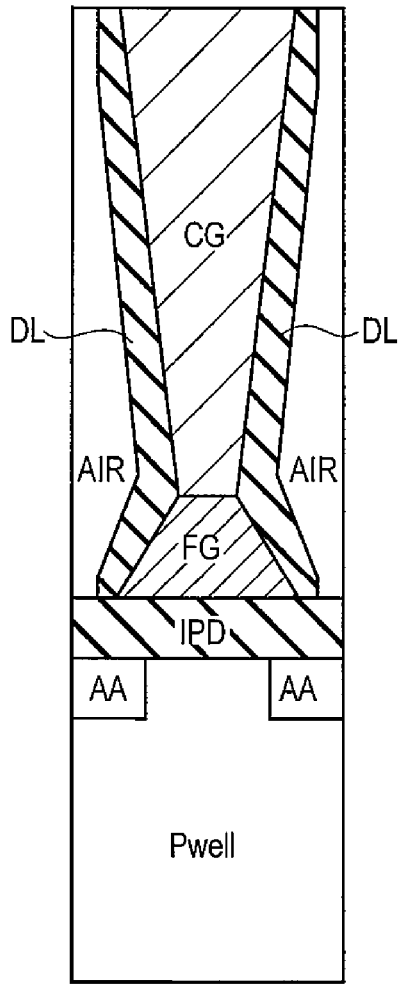 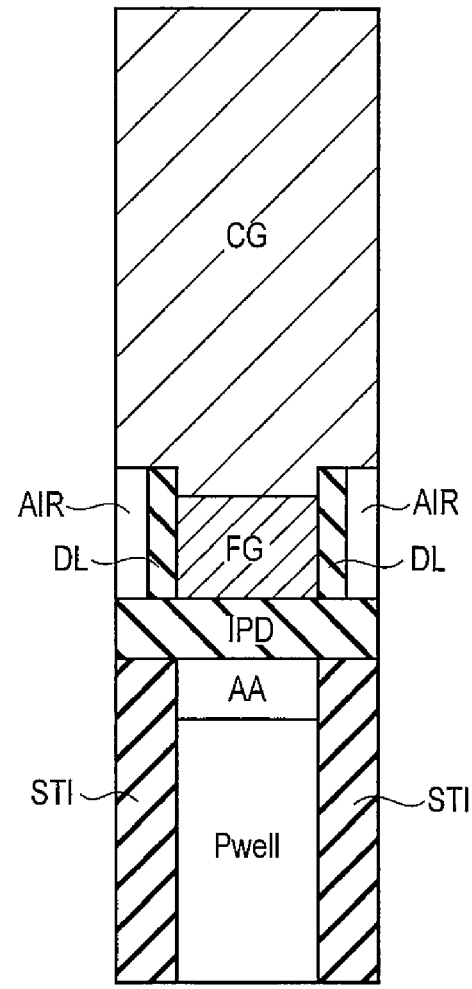
F I G. 3A  F I G. 3B

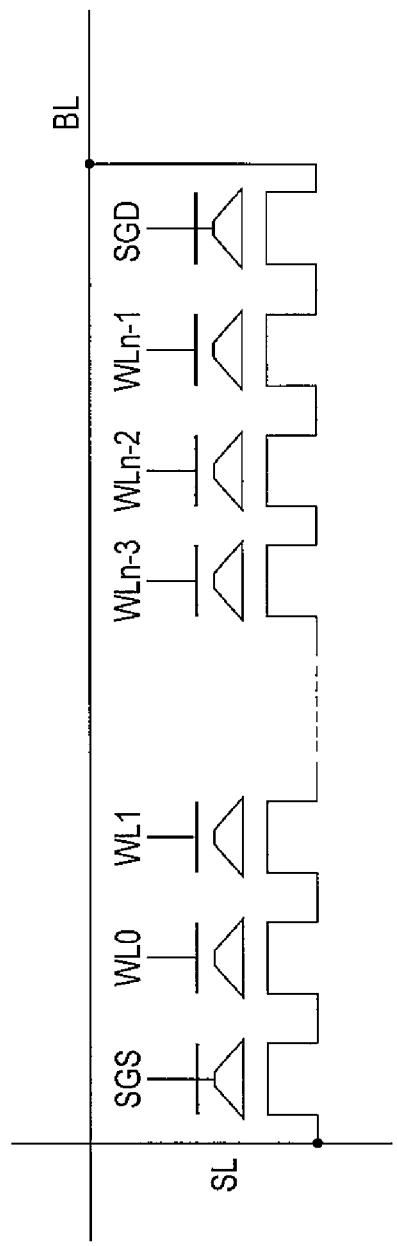
F I G. 4

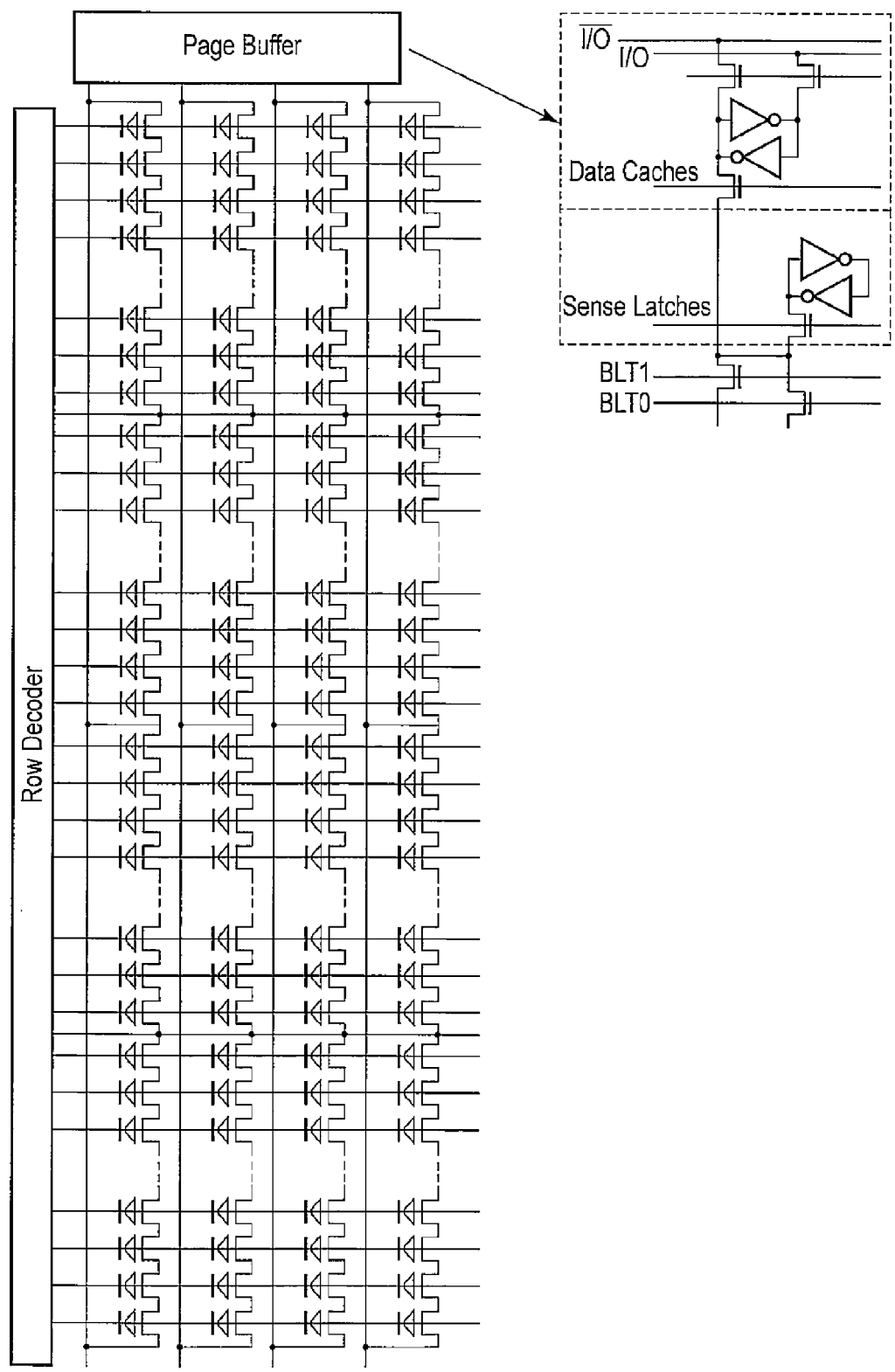
F I G. 11

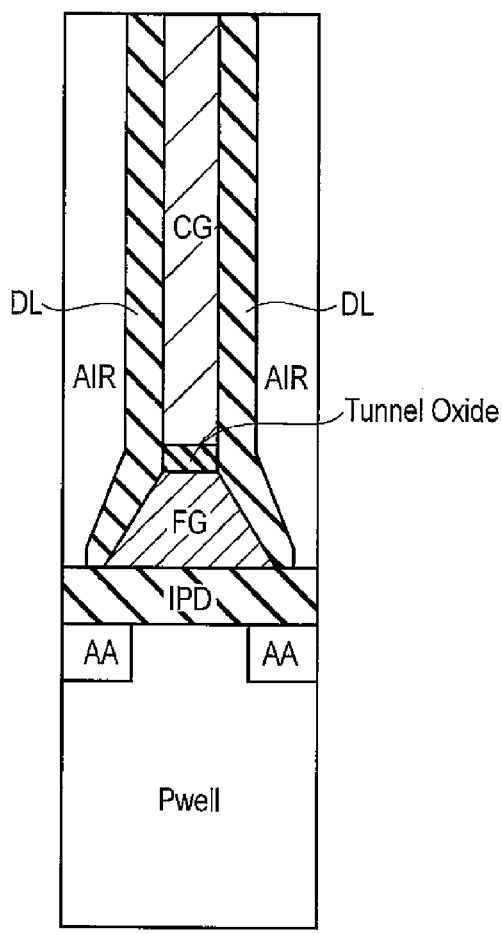 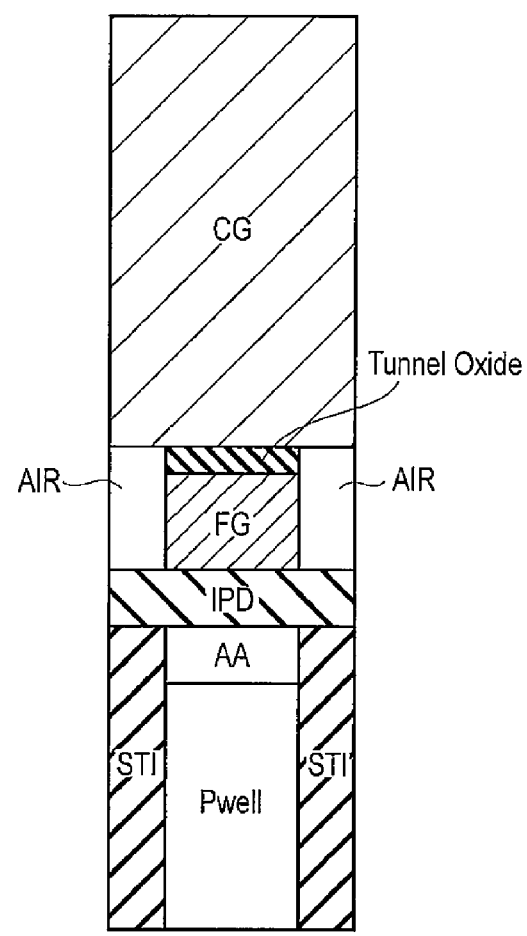
F I G. 14A            F I G. 14B

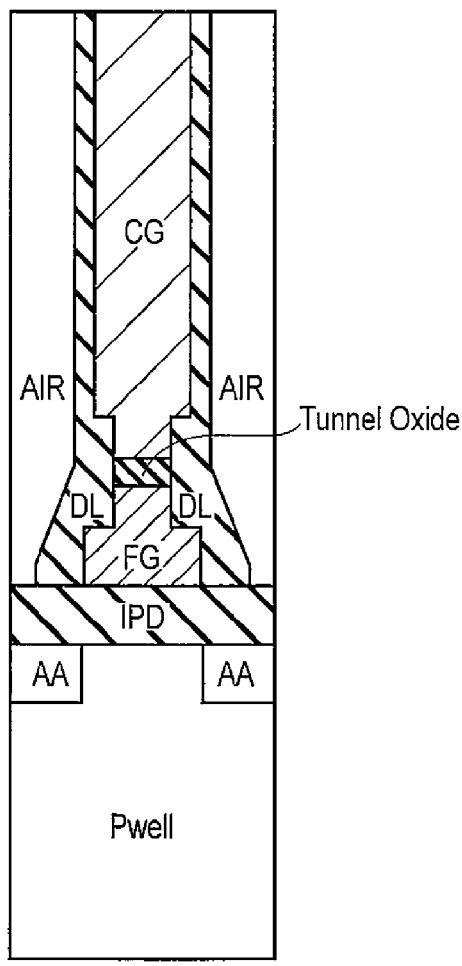 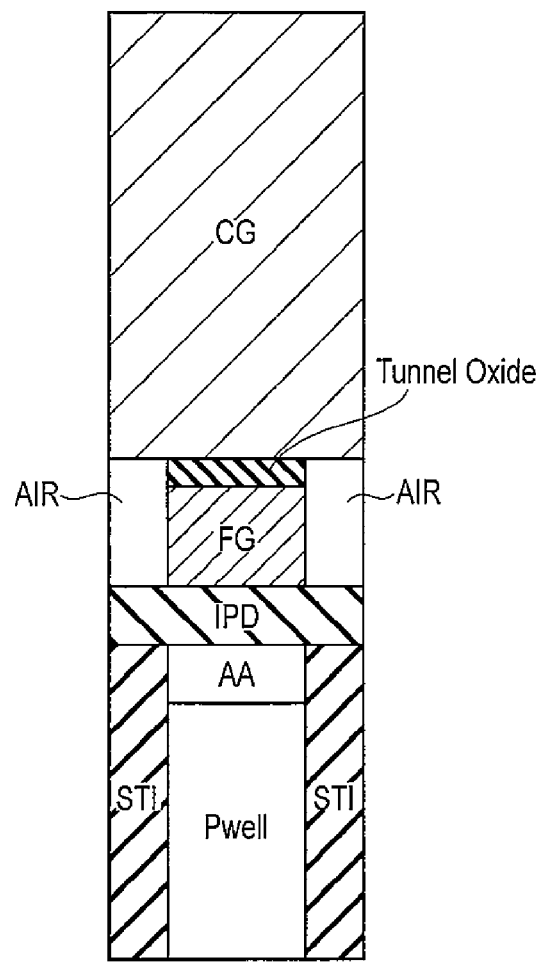
F I G. 16A    F I G. 16B

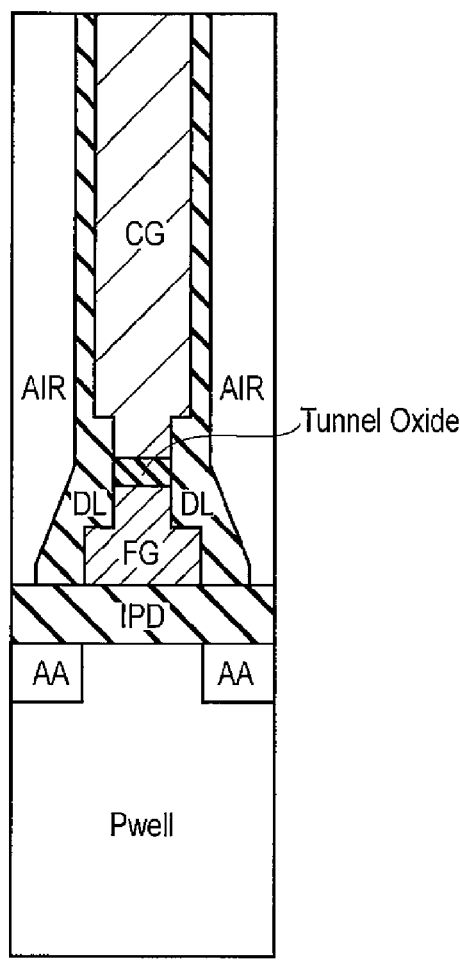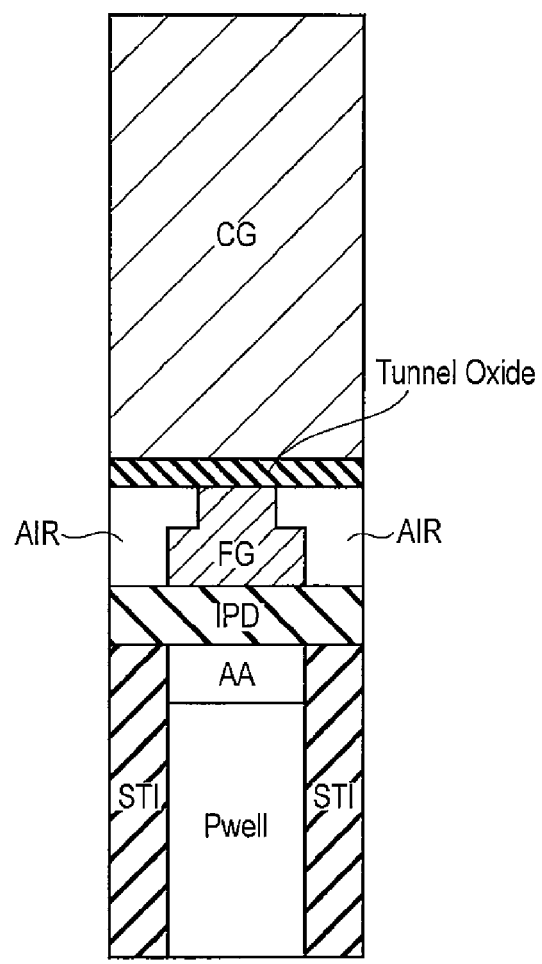
F I G. 17A    F I G. 17B

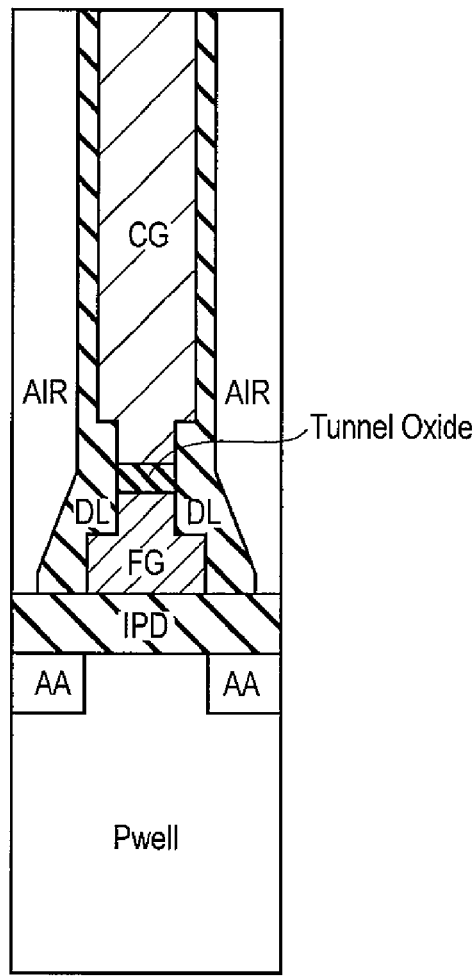 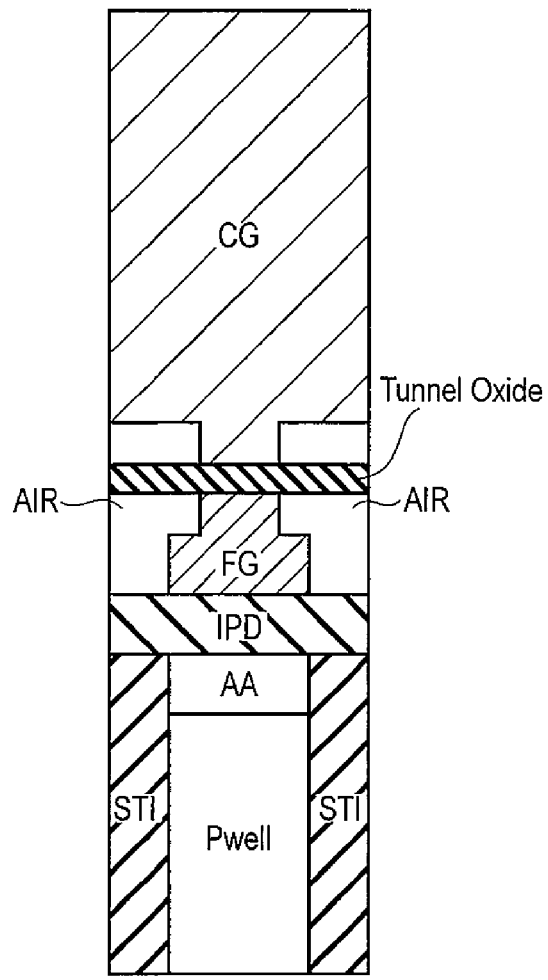
F I G. 18A  F I G. 18B

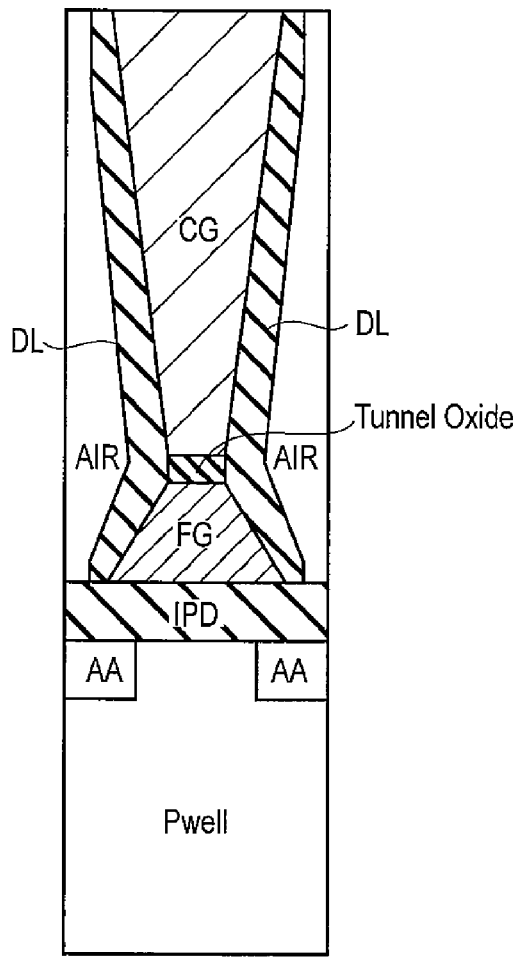 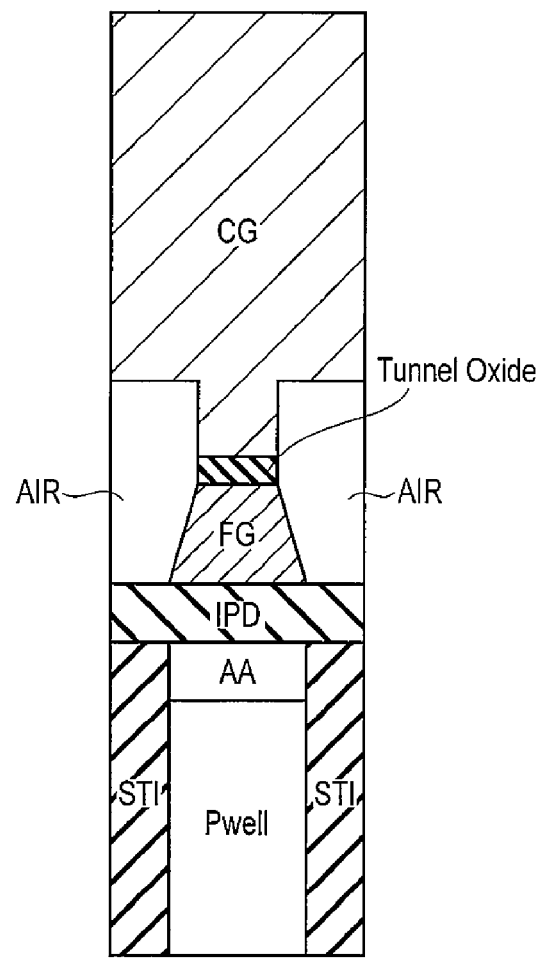
F I G. 19A    F I G. 19B

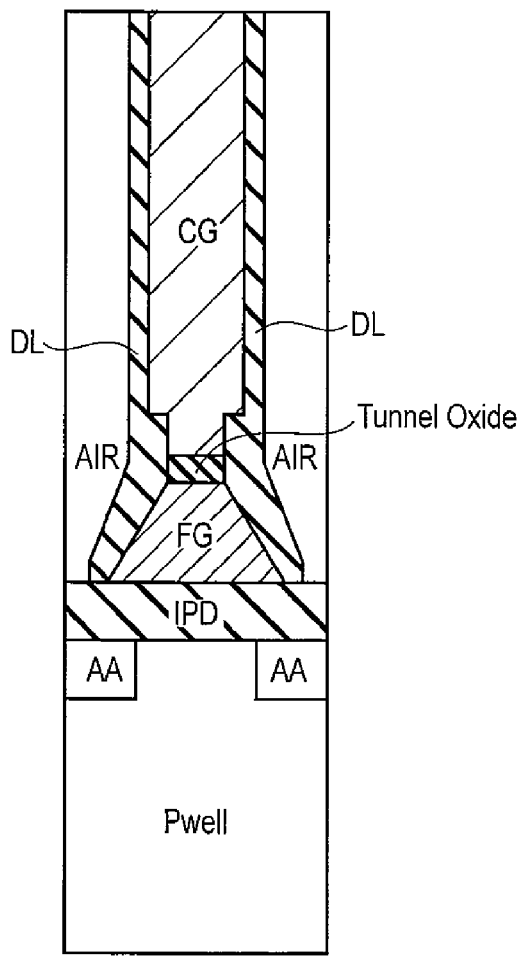
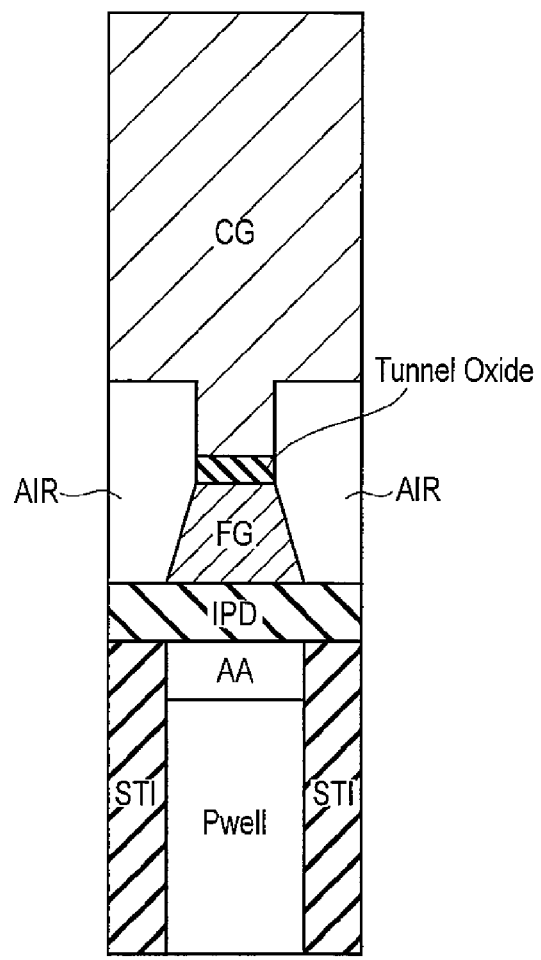
F I G. 20A　　　　　　F I G. 20B

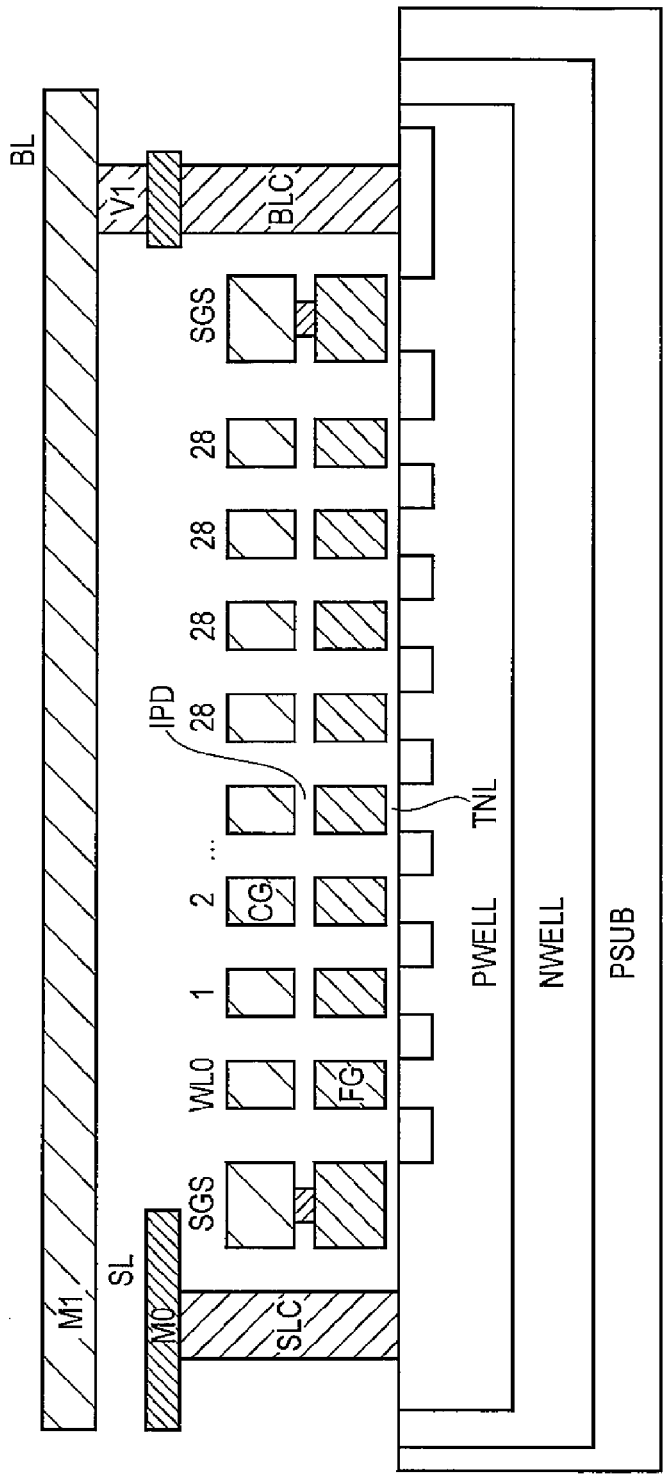
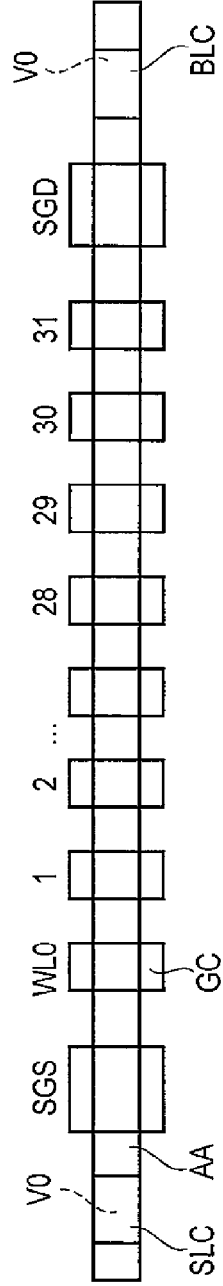
FIG. 21A
FIG. 21B

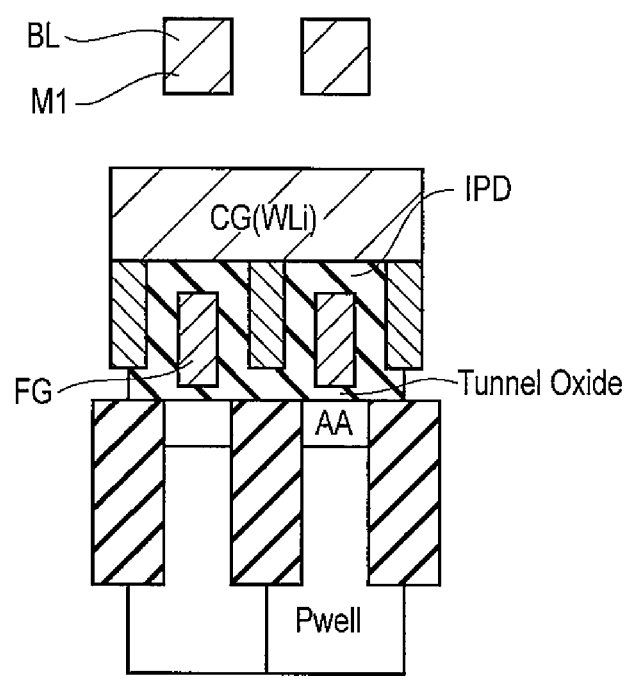
F I G. 22

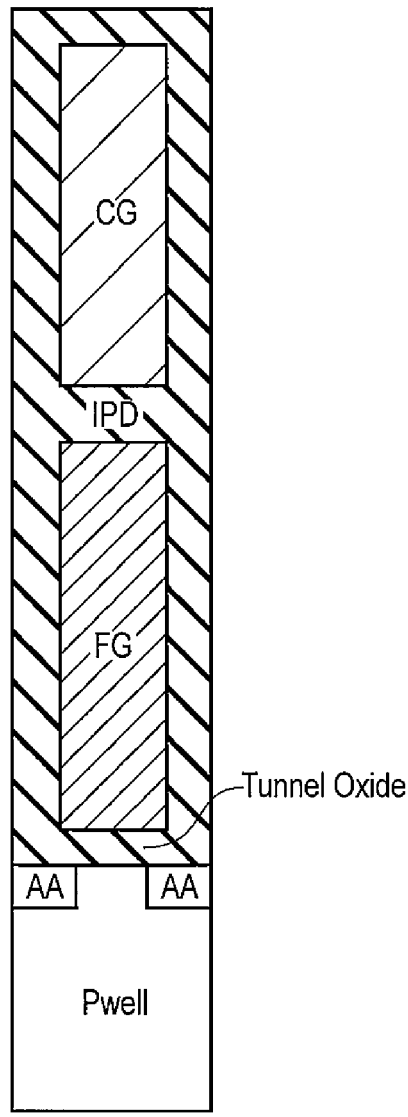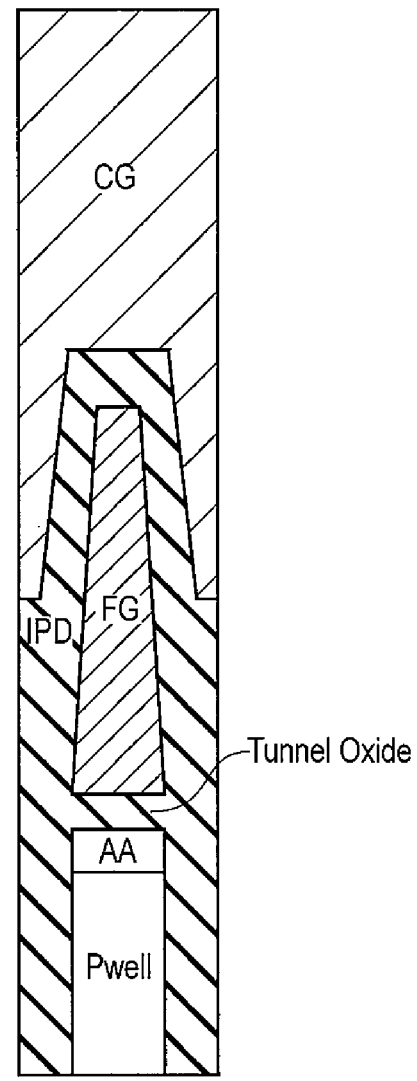
F I G. 24A    F I G. 24B

NON-VOLATILE MEMORY HAVING CHARGE STORAGE LAYER AND CONTROL GATE

CROSS-REFERENCE TO RELATED APPLICATIONS

This application is based upon and claims the benefit of priority from prior Japanese Patent Application No. 2011-064932, filed Mar. 23, 2011, the entire contents of which are incorporated herein by reference.

FIELD

Embodiments described herein relate generally to a non-volatile memory which can secure a coupling ratio of cells and enable scaling of memory cells without forming a three-dimensional inter poly dielectric and using an inter poly dielectric of a high permittivity in a miniaturized NAND flash memory.

BACKGROUND

Nowadays, semiconductor memories are utilized everywhere such as in main storages of large computers, personal computers, home appliances and mobile telephones. The NAND flash memories (NAND-type Flash EEPROM) are growing in the market, and various memory cards (SD, MMC and CF cards) or USB memories which store information including images, movies, sounds and games are used as storage media for digital cameras, digital video cameras, music equipment such as MP3, mobile telephones and mobile PCs and as storage media for such as digital TVs.

If a NAND flash memory of several hundred GB can be realized, it is also possible to replace a HDD for a PC, with this NAND flash memory. Flash-EEPROM type non-volatile memories mainly include a NOR type and a NAND type, and, although the NOR type is used to store command codes of a mobile device having about the thirteenth power of ten for the number of high speed Read and Read, it has a narrow effective bandwidth and is not suitable for recording files. By contrast, because the NAND type can realize higher integration compared to the NOR type, and, moreover, can perform Burst Read and has a wider effective bandwidth of Write even though an access time is, for example, 25 us and is slow, can program and erase a greater number of bits at a time even though an erase time is about several ms and is slow, and can import write data by way of Burst and program a greater number of bits at a time and thus has a wider effective bandwidth, and therefore the NAND type is widely used in the above market.

BRIEF DESCRIPTION OF THE DRAWINGS

FIGS. 1A and 1B are sectional views of a NAND flash memory cell according to a first embodiment, and FIG. 1A is a sectional view in a bit line direction and FIG. 1B is a sectional view in a word line direction;

FIGS. 2A and 2B are sectional views of a NAND flash memory cell according to a first embodiment, and FIG. 2A is a sectional view in a bit line direction and FIG. 2B is a sectional view in a word line direction;

FIGS. 3A and 3B are sectional views of a selected transistor arranged at both ends of a NAND flash memory cell String according to the first embodiment, and FIG. 3A is a sectional view in the bit line direction and FIG. 3B is a sectional view in the word line direction;

FIG. 4 is an equivalent circuit diagram of the NAND flash memory cell String according to the first embodiment;

FIG. 11 is a cell array configuration diagram of the NAND flash memory cell according to the first embodiment;

FIG. 12A is a sectional view in the bit line direction and FIG. 12B is a sectional view in the word line direction;

FIG. 13A is a sectional view in the bit line direction and FIG. 13B is a sectional view in the word line direction;

FIGS. 14A and 14B are sectional views of a NAND flash memory cell according to a fourth embodiment, and FIG. 14A is a sectional view in the bit line direction and FIG. 14B is a sectional view in the word line direction;

FIG. 15A is a sectional view in the bit line direction and FIG. 15B is a sectional view in the word line direction;

FIGS. 16A and 16B are sectional views of a NAND flash memory cell according to a sixth embodiment, and FIG. 16A is a sectional view in the bit line direction and FIG. 16B is a sectional view in the word line direction;

FIGS. 17A and 17B are sectional views of a NAND flash memory cell according to a seventh embodiment, and FIG. 17A is a sectional view in the bit line direction and FIG. 17B is a sectional view in the word line direction;

FIGS. 18A and 18B are sectional views of a NAND flash memory cell according to an eighth embodiment, and FIG. 18A is a sectional view in the bit line direction and FIG. 18B is a sectional view in the word line direction;

FIGS. 19A and 19B are sectional views of a NAND flash memory cell according to a ninth embodiment, and FIG. 19A is a sectional view in the bit line direction and FIG. 19B is a sectional view in the word line direction;

FIGS. 20A and 20B are sectional views of a NAND flash memory cell according to a tenth embodiment, and FIG. 20A is a sectional view in the bit line direction and FIG. 20B is a sectional view in the word line direction;

FIGS. 21A and 21B illustrate a memory cell structure of a NAND flash memory according to a comparative example, and FIG. 21A is a sectional view in the bit line direction and FIG. 21B is planar view;

FIG. 22 illustrates the memory cell structure of the NAND flash memory according to the comparative example (a sectional view in the word line direction);

FIGS. 24A and 24B illustrate a sectional structure of a minute cell of the NAND flash memory according to the comparative example, FIG. 24A is a sectional view in a bit line direction and FIG. 24B is a sectional view in a word line direction.

DETAILED DESCRIPTION

In general, according to one embodiment, a non-volatile memory includes a first non-volatile memory cell and a first selected transistor. The first non-volatile memory cell includes a first insulating film, a first floating gate, a second insulating film, a first gate electrode, a first source electrode, a first drain electrode, and a first drain electrode. The first insulating film is formed on a first silicon channel. The first floating gate is formed on the first insulating film. The second insulating film is formed on the first floating gate. The first gate electrode is formed on the second insulating film. The first drain electrode and first drain electrode are formed adjacent to the first silicon channel.

The first selected transistor includes a third insulating film, a second floating gate, a fourth insulating film, a second gate electrode, a first contact, a second source electrode, and a second drain electrode. The third insulating film is formed on a second silicon channel. The second floating gate is formed on the third insulating film. The fourth insulating film is formed on the second floating gate. The second gate electrode is formed on the fourth insulating film. The first contact connects the second floating gate and a fourth gate electrode. The second source electrode, and a second drain electrode are formed adjacent to a second silicon channel. A first cell block is formed by connecting a plurality of first non-volatile memory cells in series, connecting one ends of the first non-volatile memory cells to a bit line through the first selected transistor, and connecting other ends of the first non-volatile memory cells to a source line through the first selected transistor, and in the non-volatile memory in which a plurality of the first cell blocks are aligned, an area S1 of the first insulating film at which the first floating gate is in contact with the first silicon channel is larger than an area S2 of the second insulating film at which the first floating gate is in contact with the first gate electrode.

First, a comparative example according to the present embodiments will be described using FIGS. 21 to 24. FIG. 21A illustrates a cross section of a NAND flash memory cell String according to the comparative example. FIG. 21B is a plan view seen from above. FIG. 22 illustrates a cross section in a word line direction in FIG. 21. While this cell String allows independent programming of a cell connected to an arbitrary word line, the entire selected cell String is erased by Erase.

Figure 23:
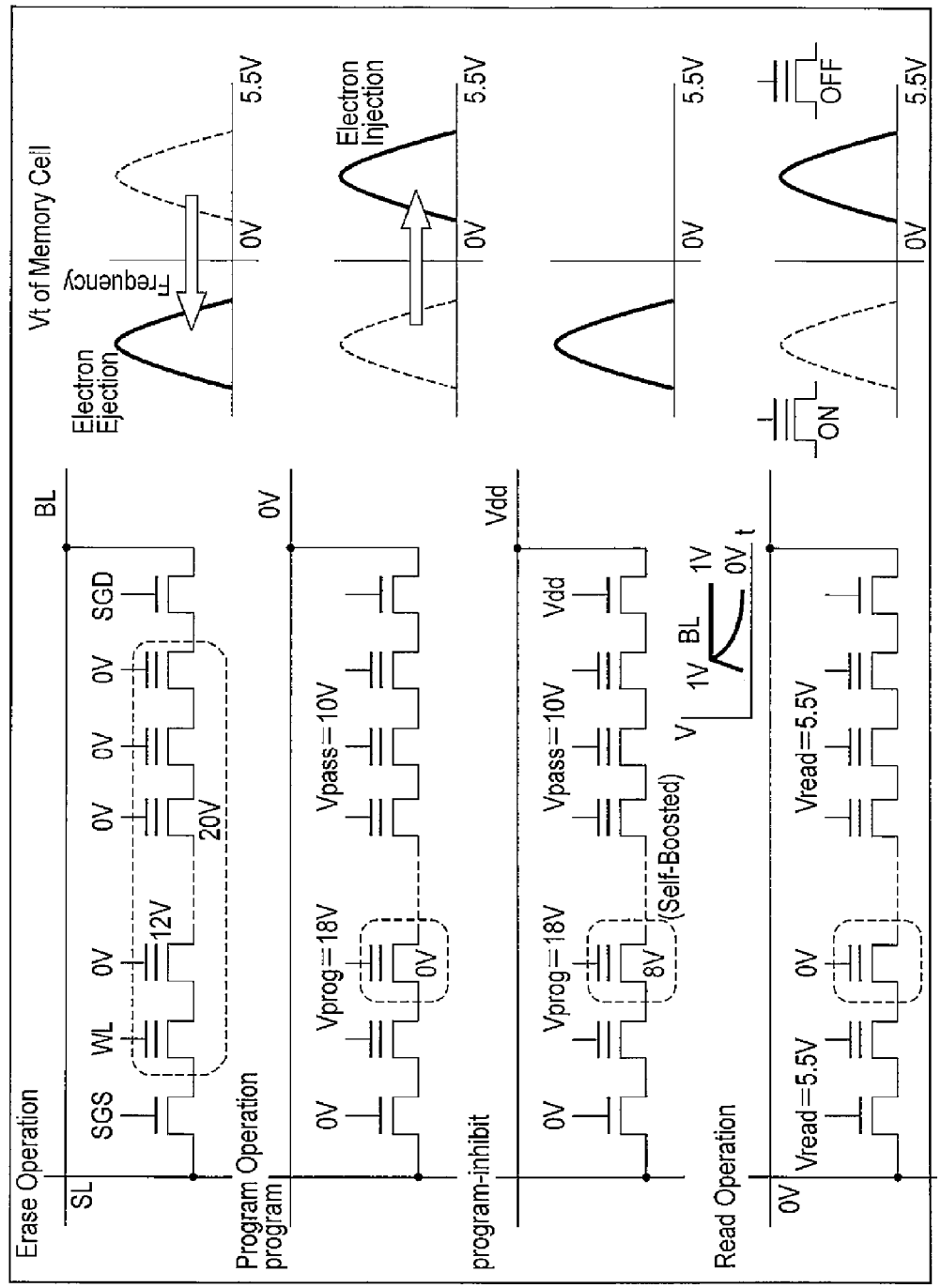
FIG. 23 is an operation diagram of Erase, Program and Read of the NAND flash memory according to the comparative example.

FIG. 23 illustrates a specific example of Program and Erase according to the comparative example. Erase is directed to applying a negative voltage between a gate and a channel of a cell, flowing electrons of a floating gate from the floating gate to the channel, and shifting a threshold voltage of the cell to a negative side. Program is directed to increasing a gate voltage to about 18 V only for a selected cell, maintaining 0 V on the channel side and injecting electrons from the channel to the floating gate. For Program Inhibit cells, the channel side is increased to about 8 V, and injection of electrons is suppressed. Upon Read, for example, about 0 V is maintained only for a word line which is a gate of the selected cell, and, if the threshold voltage is positive, the current does not flow to the cell String and the potential of the bit line is kept High and, if the threshold voltage is negative, the current flows to the cell String, the potential of the bit line decreases to Low, so that it is possible to decide whether data indicates "0" or "1".

To stabilize such a NAND flash memory, the capacitance between the floating gate and a gate electrode (word line) needs to be greater than the capacitance between the floating gate and the channel, and, moreover, an insulating film (IPD: Inter Poly Dielectric) between the floating gate and the gate electrode (word line) needs to be thicker than a tunnel insulating film between the floating gate and the channel.

This is because, when, for example, 18 V is applied to the word line and 0 V is applied to the channel, the voltage applied between the floating gate and the channel needs to be higher than the voltage applied between the floating gate and the gate according to the capacitance ratio, and a tunnel oxide film needs to be thinner than the IPD to allow electrons to pass. As illustrated in FIG. 23, with current NAND flash memories, to meet these conditions, IPD films are formed not only on an upper portion but also on side portions of the floating gate to have a greater thickness while securing an area in which the floating gate and the gate electrode are in contact through the IPDs.

However, when a design rule for memory cells is less than 30 nm, as illustrated in FIG. 24, the floating gate becomes elongated to keep thick IPD films and secure the total capacitance of the IPDs. Further miniaturization makes it difficult to form two thick IPD films in one cell size in a horizontal direction, and reaches a miniaturization limit.

Meanwhile, FIG. 24A illustrates a cross section in the bit line direction, and FIG. 24B illustrates a cross section in the word line direction. When an IPD film is formed only on an upper portion of a floating gate, although a sufficient capacitance ratio can be obtained, Program and Erase do not normally operate. Further, although operations can be executed by forming the IPD film only on the upper portion of the floating gate if the IPD film has a very high relative permittivity, a material having a high permittivity generally causes a significant leak current because barrier height decreases, and as a result the operations become difficult.

Furthermore, there are concerns of breakdown and leakage when a sidewall gate electrode and a channel are arranged closer in FIG. 24B, and therefore these cannot be arranged closer, resulting in a seriously significant interference between adjacent floating gates. As described above, further scaling of cells is becoming difficult with conventional NAND-type flash memories.

Hereinafter, the embodiments will be described with reference to the drawings in view of the above comparative example.

First Embodiment

The embodiments will be described below. FIG. 1 illustrates a memory cell structure which can be applied to a NAND flash memory or other flash memories according to a first embodiment of the present embodiments.

FIG. 1A illustrates a cross section in the bit line direction, and FIG. 1B illustrates a cross section in the word line direction. On a Pwell, a channel is formed between a source and drain diffusion layers AA, an insulating film (IPD) is formed on the channel, and a floating gate is formed on the insulating film.

The floating gate has a trapezoidal shape in which an upper side is shorter than a lower side seen from the bit line direction. A tunnel film is formed on the floating gate, and the gate electrode is formed on the tunnel film. Features include that an IPD is thicker than the tunnel film. These films are covered by an insulating film DL, and a gas or a vacuum air gap is provided between adjacent cells. As illustrated in FIG. 1B, each AA (Active Area) is isolated by an element isolation insulating film STI (Shallow Trench Isolation) in the word line direction.

FIG. 2 illustrates that a plurality of cells illustrated in FIG. 1 are aligned. FIG. 2A illustrates a cross section in the bit line direction, and FIG. 2B illustrates a cross section in the word line direction. Gate electrodes are connected through the word line in the word line direction. Sources and drains of the cells are connected in series in the bit line direction.

FIG. 3 illustrates a cross section of a selected transistor arranged at both ends of a cell String when a NAND flash memory cell String is formed. FIG. 3A illustrates a cross section in the bit line direction, and FIG. 3B illustrates a cross section in the word line direction. This structure adopts the almost same structure as the cell in FIG. 1 except that injection and emission of electrons to the floating gate possibly cause a change of a threshold voltage of the selected transistor, which is inconvenient for the selected transistor, and therefore a part or a portion of the tunnel oxide film on the floating gate is peeled off to connect the gate electrode and the floating gate through, for example, a contact which is a conducting body.

Although the entire tunnel oxide film is peeled off with an example of FIG. 3, a part of the tunnel film may be formed using a contact. FIG. 4 illustrates a circuit diagram of a cell String when the NAND flash cell String is formed using FIGS. 1 to 3. The floating gate is shown in a trapezoidal shape with a short upper side, and the floating gates and the gate electrodes of selected transistors which receive inputs of selection signals SGS and SGD are electrically short-circuited.

Figure 5:
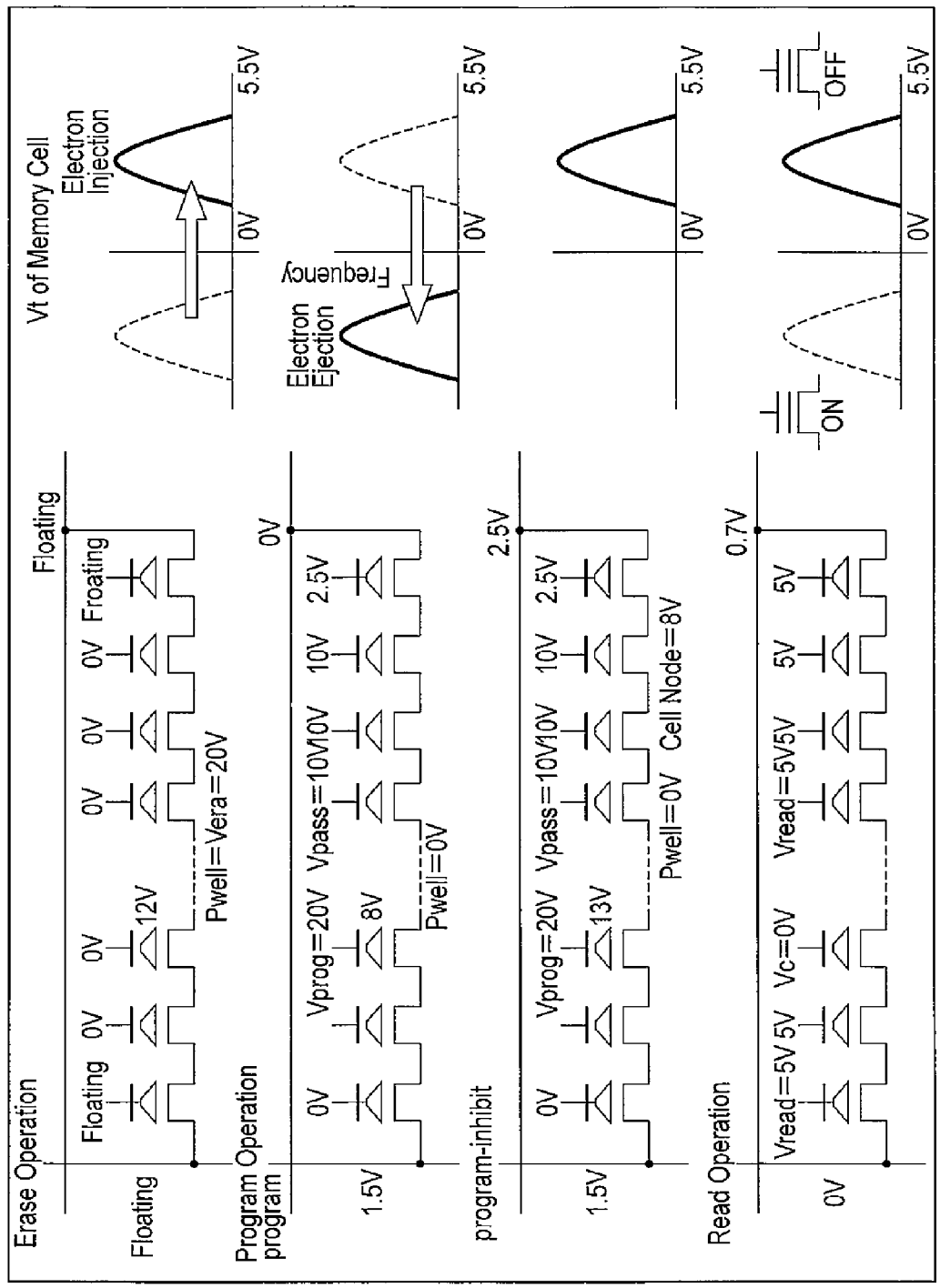
FIG. 5 is an operation diagram of the NAND flash memory cell String according to the first embodiment.

FIG. 5 illustrates Program, Erase and Read operations when one-bit information is stored in one cell in the NAND flash memory which adopts the structure in FIGS. 1 to 4 according to the present embodiment.

The Erase operation is directed to maintaining 0 V for the word line, and increasing the voltages of the well, the source, the drain and the channel to about 20 V. In this case, as illustrated in FIGS. 1 and 2, an area of the IPD film at which the channel and the floating gate are in contact is larger than an area at which the floating gate and the gate electrode are in contact, and therefore even in a situation in which the thickness of the IPD is thicker than the thickness of the tunnel film, a value of the capacitance between the channel and the floating gate is greater than the capacitance between the floating gate and the gate electrode (word line), and, as a result, a value equal to or more than 10 V and less than 20 V of the voltage applied between the channel and the gate electrode is applied to the tunnel film side between the floating gate and the gate electrode.

By this means, a FN tunnel current injects electrons from the gate electrode side to the floating gate side, and the Erase operation boosts a threshold voltage Vt of all cells of the selected cell String. In this case, on the IPD side, the applied voltage is low, the film thickness is thick, the electrons hardly leak and, consequently, it is possible to secure the quantity of electrons to be stably injected to the floating gate. Consequently, formation of the capacitance of the IPD sidewalls and use of a material having a very high permittivity, which are problems of conventional cells, are not required, and, with the present embodiment, only the insulating films need to be formed in surfaces parallel to Si surfaces together with the IPD film and the tunnel film, so that memory cells are easily scaled in the horizontal direction and the vertical direction. Further, the lower side of the floating gate is sufficiently wide and, therefore, it is expected to suppress a short channel effect as a transistor for the cell.

FIG. 5 illustrates a program scheme of cell information. When data needs to be written, 0 V (Program) is maintained for the bit line, and the voltage is set to about 2.5 V for the bit line connected to a cell in which data needs not to be written in the same selected word line (Program Inhibit).

Then, the voltage is boosted to, for example, 20 V for the word line of the selected cell, and the voltage of the word line of a non-selected cell of the selected String is boosted to, for example, 10 V. In this case, when data needs to be written, the voltage of a cell node becomes 0 V, and a cell node of the cell String connected to a cell in which data needs not to be written self-boosts the voltage to about 10 V. That is, in case of Program, 20 V is applied between the channel and the gate electrode, and, in case of Program Inhibit, 10 V is applied between the channel and the gate electrode.

In this case, as illustrated in FIGS. 1 and 2, an area of the IPD film at which the channel and the floating gate are in contact is larger than an area at which the floating gate and the gate electrode are in contact, and therefore even in a situation in which the thickness of the IPD is thicker than the thickness of the tunnel film, a value of the capacitance between the channel and the floating gate is greater than the capacitance between the floating gate and the gate electrode (word line), and, as a result, a value equal to or more than 10 V and less than 20 V of the voltage applied between the channel and the gate electrode is applied to the tunnel film side between the floating gate and the gate electrode. By this means, a FN tunnel current emits electrons from the floating gate side to the gate electrode side, and the Program operation decreases a threshold voltage Vt of the selected cell.

In this case, on the IPD side, the applied voltage is low, the film thickness is thick, and the electrons hardly leak and, consequently, it is possible to secure the quantity of electrons to be stably emitted from the floating gate. Consequently, formation of the capacitance of IPD sidewalls, which is a problem of conventional cells, is not required, and only the insulating films need to be formed in surfaces parallel to Si surfaces together with the IPD film and the tunnel film according to the present embodiment, so that memory cells are easily scaled in the horizontal direction and the vertical direction.

In the state of Program Inhibit, the voltage is low, so that emission of electrons from the floating gate to the gate electrode is suppressed. When programmed data is read, cells other than the selected cell is set to Vread=about 5 V, the bit line is precharged to about 0.7 V and the source line is set to 0 V. In this case, when the potential of the selected word line is set to Vcr=0 V, if the threshold voltage of the selected cell is 0 V or more, the current does not flow to the selected cell and the bit line maintains 0.7 V and, if the threshold voltage of the selected cell is less than 0 V, the current flows to the selected cell and the potential of the bit line decreases from 0.7 V, so that it is possible to read information "1" or "0" data by deciding a BL potential in a sense amplifier. In this case, the width of the lower side of the floating gate is wide, so that it is possible to sufficiently suppress the short channel effect. Further, the serial capacitance of the tunnel film and the IPD film is smaller than the conventional cell, so that the capacitance of the word line is lowered and the high speed operation is possible.

Figure 6:
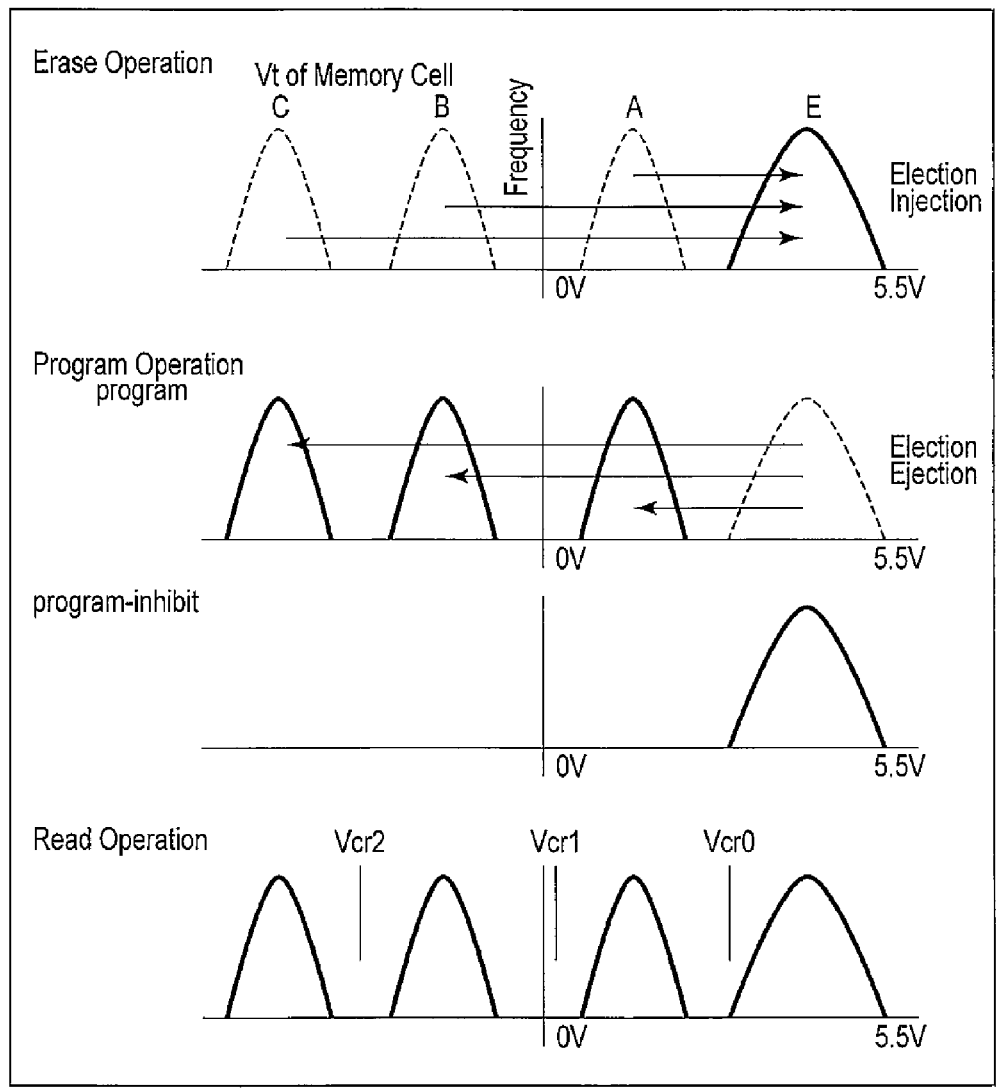
FIG. 6 is a multi-level operation diagram of the NAND flash memory cell according to the first embodiment.

FIG. 6 illustrates a multi-level operation of storing two-bit information in one cell. An Erase operation is the same as in FIG. 5, and a Program operation is directed to control the potential of a word line and control the quantity of electrons emitted from a floating gate through a tunnel film to obtain four types of threshold distributions. In this case, by changing the potential of the selected word line upon Read to Vref0, Vref1 or Vref2, it is possible to determine whether a cell transistor is turned on or off and whether a state is A, B, C or D of four states, and to read two-bit information.

In addition, an operation is desirable which shifts the maximum value of the threshold voltage illustrated in FIG. 6 to the same degree in the positive and negative directions such that a high potential is not applied to the floating gate upon Neglect or upon Standby.

Figure 7:
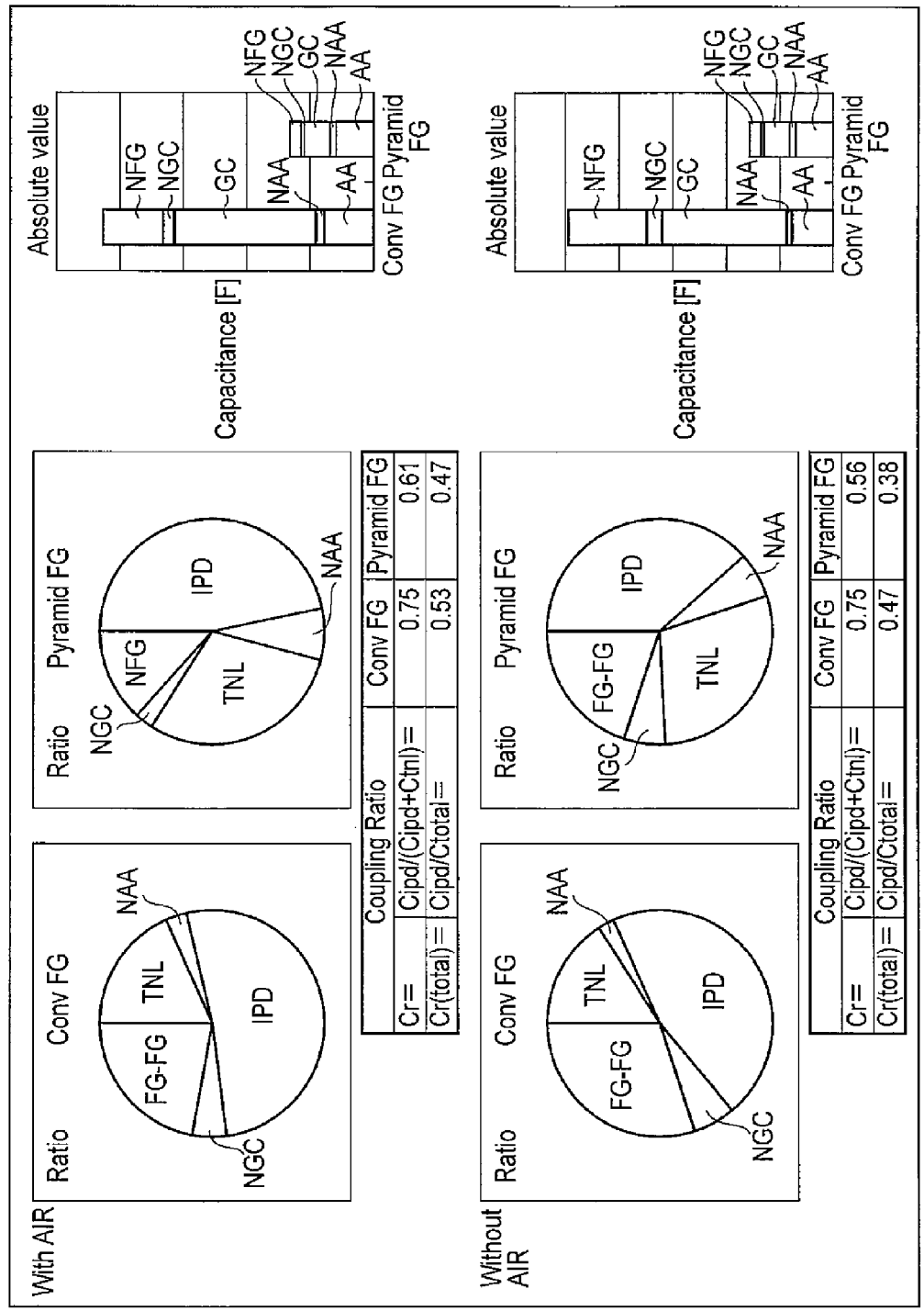
FIG. 7 is a view illustrating the capacitances and the capacitance ratios of a floating gate of a selected cell of the NAND flash memory and other portions according to the first embodiment.

FIG. 7 illustrates a value when a cell size is 40 nm×40 nm, and capacitance values and capacitance ratios of a floating gate and other portions are obtained according to simulation in case of the present embodiment and a conventional cell. A cell which is referred to as "pyramid" is the cell according to the present embodiment. With the present embodiment, the floating gate and the IPD film have sufficient values with respect to the entire capacitance although those values are not so much as the conventional cell.

Further, it is found that parasitic capacitances to an adjacent floating gate, an adjacent word line, an adjacent source and a drain are lower and more effective than the conventional cell. Thus, with the present embodiment, it is possible to secure a sufficient coupling ratio without forming an IPD film of a three-dimensional structure and an IPD film of a high permittivity. Further, it is possible to substantially reduce the absolute value of the capacitance compared to the conventional cell, and it is found that the capacitance of the word line can be reduced.

Figures 8A, 8B:
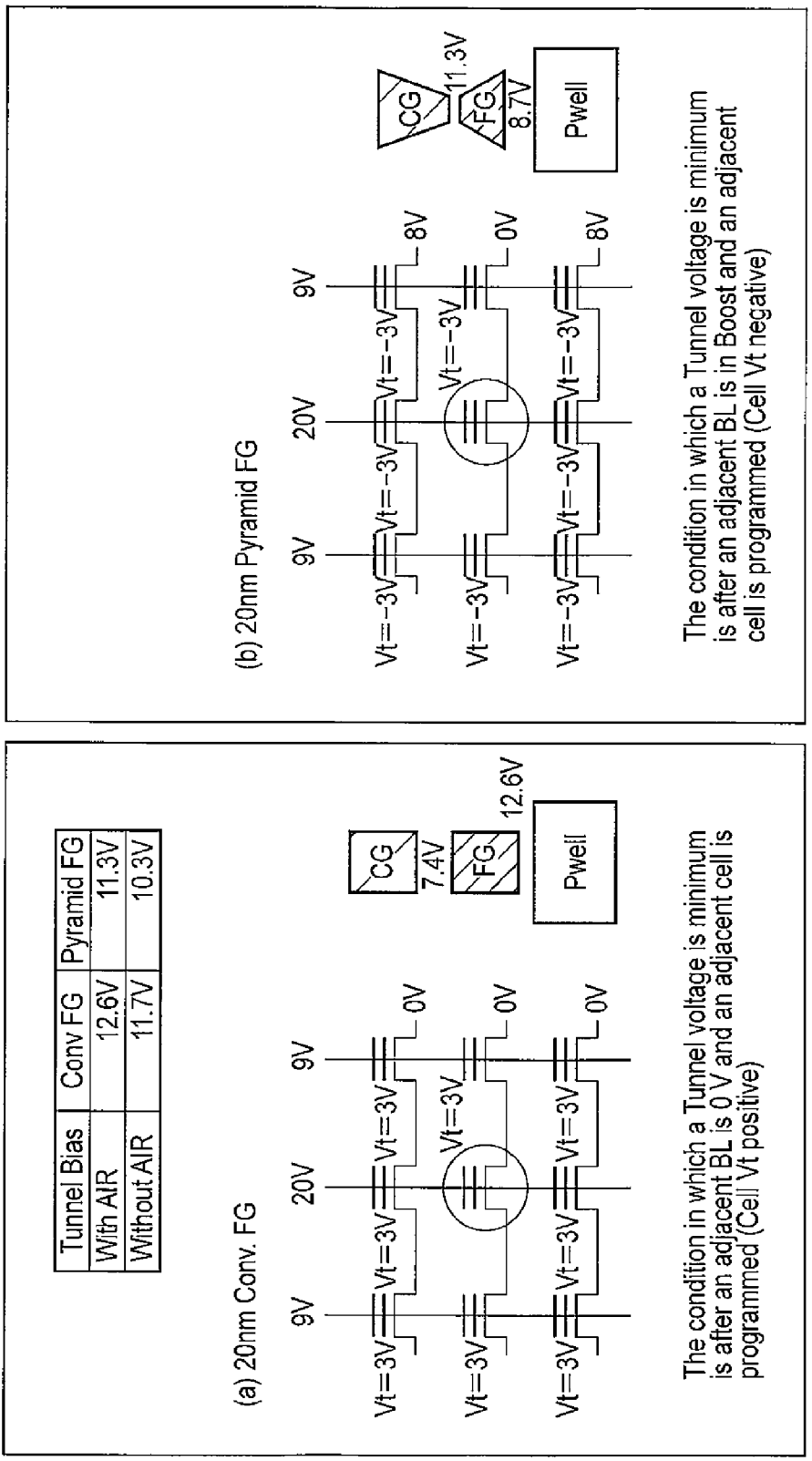
FIG. 8A is an example view illustrating the voltage to be applied to a tunnel film in a state where programming of the NAND flash memory cell becomes most difficult for reference and FIG. 8B is a view illustrating the voltage to be applied to a tunnel film in a state where programming of the NAND flash memory cell becomes most difficult according to the first embodiment.

In FIG. 8A, a voltage applied to a tunnel film in a situation in which programming according to the present embodiment becomes most difficult is calculated. In FIG. 8B, a voltage applied to a tunnel film in a situation in which programming according to the conventional becomes most difficult is calculated. The situation in which it is most difficult to program the conventional cell comes after the cell node of an adjacent cell is 0 V and the floating gate of an adjacent cell is programmed (Vt is high, that is, the potential of the floating gate is low), and the potential of the floating gate is least likely to increase and the voltage is hardly applied to the tunnel film.

The situation in which it is most difficult to program the cell according to the present embodiment comes after the cell node of an adjacent cell is 8 V and the floating gate of the adjacent cell is programmed (Vt is low, that is, the potential of the floating gate is high), and the potential of the floating gate of the selected cell is most likely to increase and the voltage is hardly applied to the tunnel film. This result shows that a sufficient voltage is applied to the tunnel film without forming an IPD film of a three-dimensional structure and an IPD film of a high permittivity. A sufficient voltage which is 11.3 V when there is an air gap and is 10.3 V without the air gap is applied to the tunnel film.

Figure 9A:
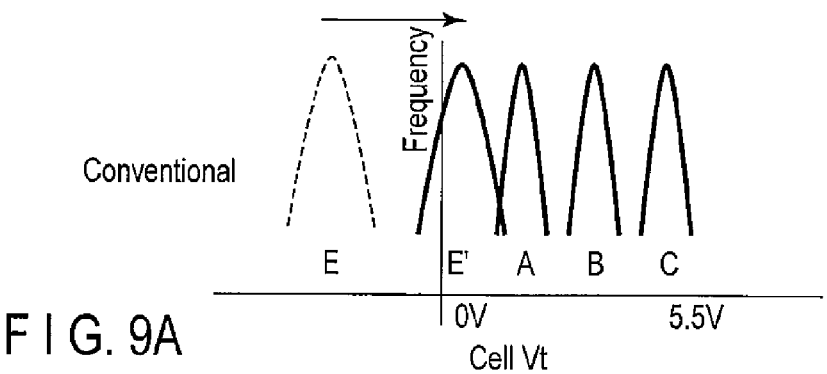
FIG. 9A is an example view illustrating Vt shift reduction resulting from coupling reduction by programming an adjacent cell of the NAND flash memory cell for reference and FIG. 9B is a view illustrating Vt shift reduction resulting from coupling reduction by programming an adjacent cell of the NAND flash memory cell according to the first embodiment.
Figure 9B:
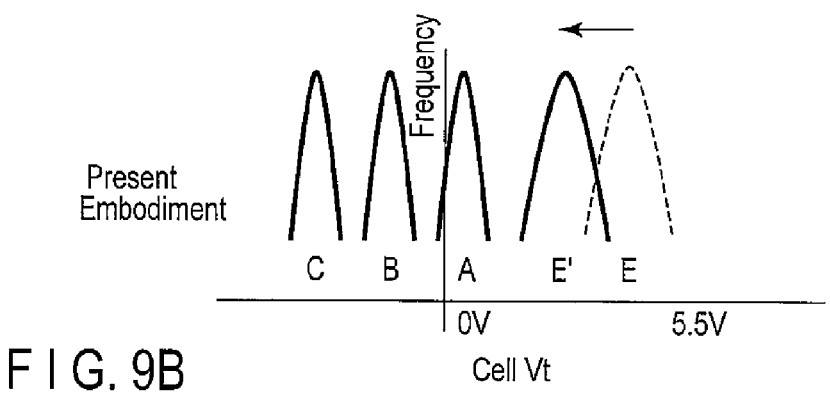

FIGS. 9A and 9B illustrate the degree of an influence of programming of an adjacent cell when information of a four-level value (two-bit) is stored in a conventional cell and a cell according to the present embodiment. According to the capacitance ratio in FIG. 7, the conventional cell is susceptible to the influence of whether or not an adjacent cell is programmed, and the cell according to the present embodiment is not susceptible. With the conventional cell, the capacitance ratio between adjacent floating gates is about 40% compared to the capacitance of the IPD and, when surrounding cells are programmed, this coupling boosts the threshold voltage and the threshold voltage overlaps a A-level distribution even in a state where the selected cell is erased. This means that multi-level information equal to or more than two bits cannot be stored. Further, it is obviously necessary to make a very deep erased state on the negative side.

By contrast, with the present embodiment, the capacitance ratio between adjacent floating gates is 30% or less and, when surrounding cells are programmed, although this coupling decreases the threshold voltage even in a state where the selected cell is erased, it is possible to prevent the threshold voltage from being provided in a A-level distribution. This means that multi-level information equal to or more than two bits can be stored.

Figure 10:
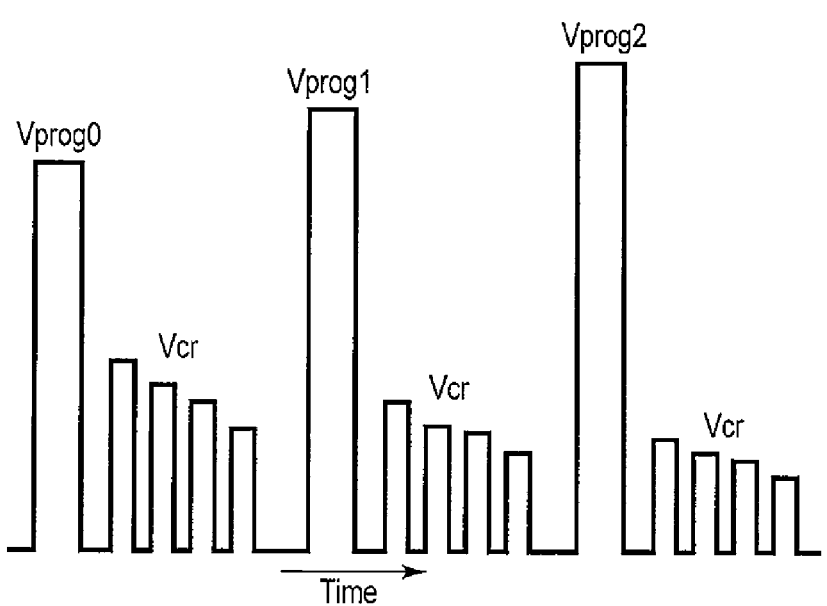
FIG. 10 is a view illustrating operation examples of Program and VerifyRead of the NAND flash memory cell according to the first embodiment.

FIG. 10 illustrates effective operation scheme examples of Program and Verify Read when multi-level bits are stored in a cell according to the present embodiment. Also with the cell of the present embodiment, there are cells which allow electrons of a floating gate to escape to a gate electrode side, and cells which hardly allow electrons of a floating gate to escape to the gate electrode side. Hence, a selected word line potential Vprog is increased a little by little from a low value to a high value, and is checked in the middle whether it reaches a desired threshold voltage going beyond Vcr. A cell Vt has a high potential immediately after Erase, and therefore the Vcr potential is decreased from a high value to a low value, cells which need to be set in a state where Vt is high are checked one by one in order whether they are programmed and, if Vt is not insufficiently decreased, the Vprog potential is further increased to program the cells and Vcr is increased again to check whether the cells are programmed.

Moreover, Vprogm is further increased to program cells for which target is at a state where Vt is low, and test the cells at a further lower Vcr potential. Bit lines with which the programmed cells are connected are set to High, and need to be placed in a Program Inhibit state. As described above, the difference from conventional Program and Verify Read is that a method is desirable of sequentially decreasing the potential of Verify Read from a high value to a low value.

FIG. 11 illustrates an example of a NAND flash memory cell array which is applicable to the present embodiment. A Block and a Page to select are activated by a row decoder and are connected to a bit line. A page buffer is operated to perform Read/Program/Vrrify operations.

FIGS. 12A and 12B to FIGS. 20A and 20B illustrate other memory structures according to the second to the tenth embodiments of the present embodiments. The memory structures in FIGS. 12A and 12B to FIGS. 20A and 20B provide the almost same effects as in FIGS. 1 to 11, and can adopt the same scheme as such as the operations in FIGS. 1 to 12.

Figure 12A:
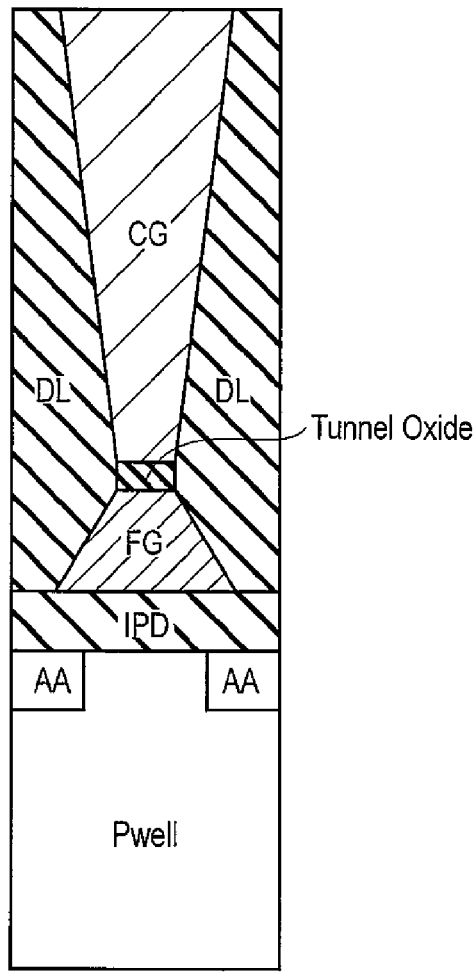
FIGS. 12A and 12B are sectional views of a NAND flash memory cell according to a second embodiment.
Figure 12B:
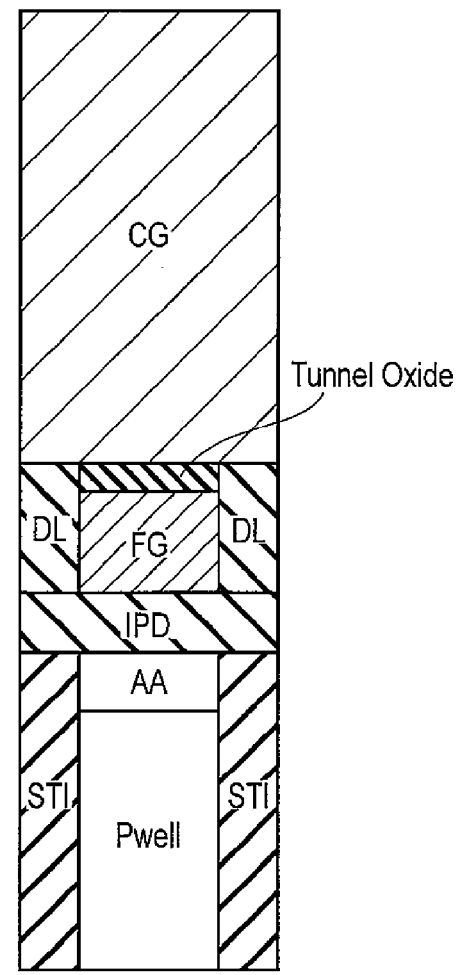

FIGS. 12A and 12B illustrate a memory structure which is applicable to a NAND flash memory or other flash memories according to the second embodiment of the present embodiments. FIG. 12A illustrates a cross section in the bit line direction, and FIG. 12B illustrates a cross section in the word line direction. While the effect is the almost same as in FIG. 1, and the difference is that no air gap is provided, and although the memory structure is easier to manufacture, the capacitance between adjacent members increases.

Figure 13A:
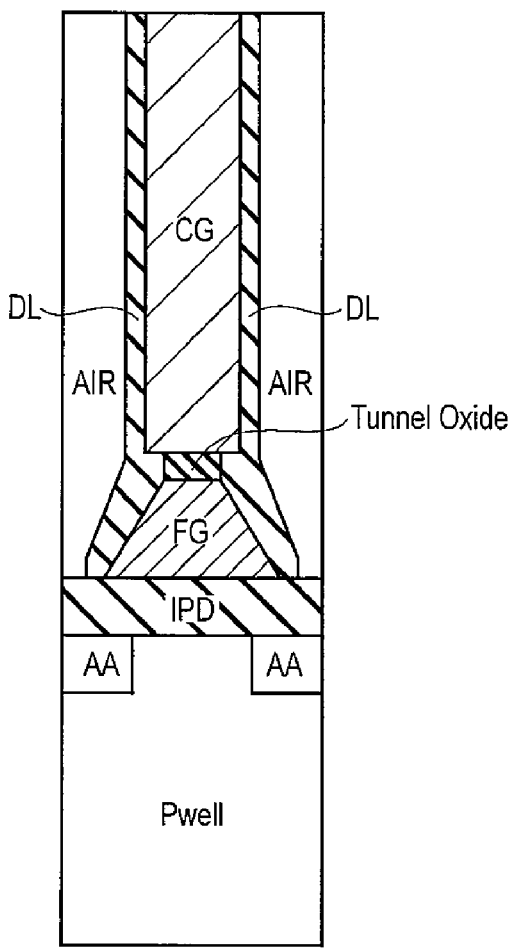
FIGS. 13A and 13B are sectional views of a NAND flash memory cell according to a third embodiment.
Figure 13B:
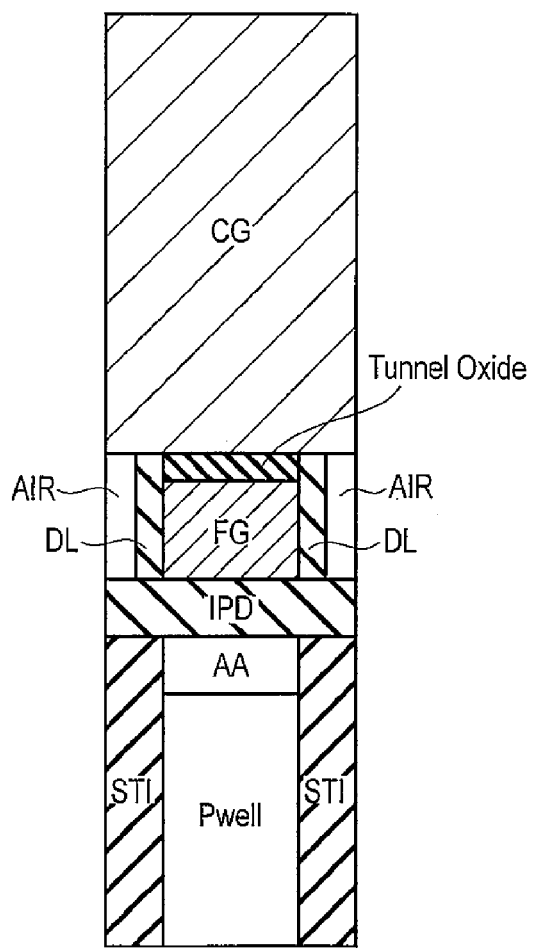

FIGS. 13A and 13B illustrate a memory structure which is applicable to a NAND flash memory or other flash memories according to the third embodiment of the present embodiments. FIG. 13A illustrates a cross section in the bit line direction, and FIG. 13B illustrates a cross section in the word line direction. The effect is the almost same as in FIG. 1, and the difference is that the width of gate electrodes is wider. Although features of the memory structure lie in shorter delay of word lines, the memory structure has drawbacks that, for example, the capacitance of the tunnel film increases and the coupling ratio decreases.

FIGS. 14A and 14B illustrate a memory structure which is applicable to a NAND flash memory or other flash memories according to the fourth embodiment of the present embodiments. FIG. 14A illustrates a cross section in the bit line direction, and FIG. 14B illustrates a cross section in the word line direction. The effect is almost the same as in FIG. 1, and the difference is that no air gap is provided only in the word line direction, that is, the air gap is removed only in the word line direction in which it is difficult to provide the air gap. While this memory structure is easy to manufacture, this memory structure has a drawback that, for example, an adjacent capacitance in the word line direction of the tunnel film increases.

Figure 15A:
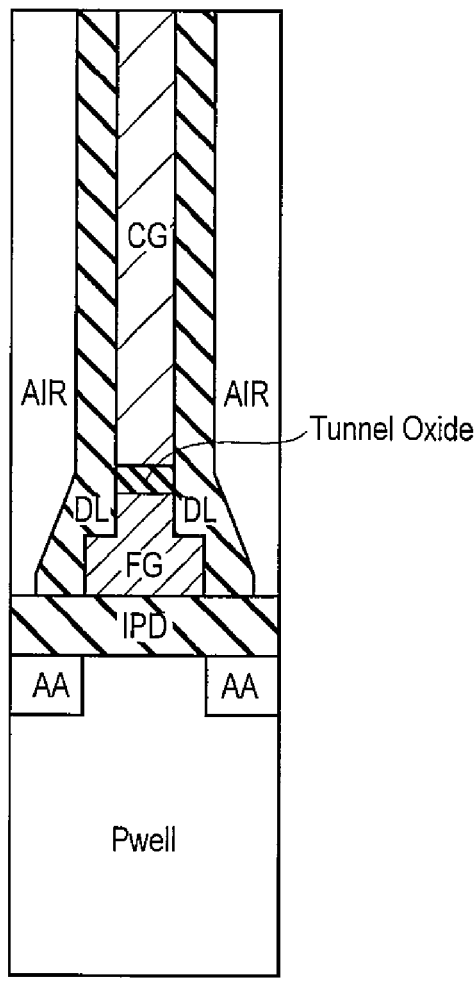
FIGS. 15A and 15B are sectional views of a NAND flash memory cell according to a fifth embodiment.
Figure 15B:
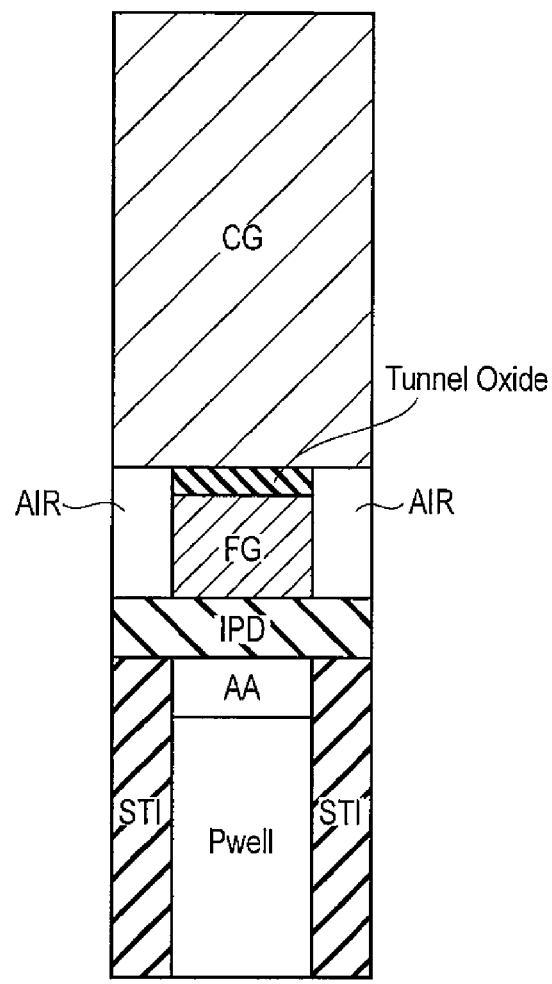

FIGS. 15A and 15B illustrate a memory structure which is applicable to a NAND flash memory or other flash memories according to the fifth embodiment of the present embodiments. FIG. 15A illustrates a cross section in the bit line direction, and FIG. 15B illustrates a cross section in the word line direction. The effect is the almost same as in FIG. 1, and the difference is that the floating gate has a convex shape instead of a trapezoidal shape. In some cases, depending on the process, the present embodiment more facilitates manufacturing.

FIGS. 16A and 16B illustrate a memory structure which is applicable to a NAND flash memory or other flash memories according to the sixth embodiment of the present embodiments. FIG. 16A illustrates a cross section in the bit line direction, and FIG. 16B illustrates a cross section in the word line direction. The effect is the almost same as in FIG. 16, and the difference is that the features of this memory structure lie in a wider upper portion of the gate electrode than the lower portion. It is effective to reduce the resistance of a word line while reducing the capacitance of a tunnel film.

FIGS. 17A and 17B illustrate a memory structure which is applicable to a NAND flash memory or other flash memories according to the seventh embodiment of the present embodiments. FIG. 17A illustrates a cross section in the bit line direction, and FIG. 17B illustrates a cross section in the word line direction. The effect is almost the same as in FIG. 16, and the first difference is that a tunnel film below a gate electrode is not divided in the word line direction. As described in the present embodiment, as well as in the other embodiments, an IPD film and a tunnel film may be provided only at a portion in contact with a floating gate or at other portions, and an optimal structure only needs to be selected according to a manufacturing method. The second difference is that the floating gate also has a convex shape in the word line direction. It is possible to further reduce an area of the tunnel film in contact with the floating gate, and improve the coupling ratio.

FIGS. 18A and 18B illustrate a memory structure which is applicable to a NAND flash memory or other flash memories according to the eighth embodiment of the present embodiments. FIG. 18A illustrates a cross section in the bit line direction, and FIG. 18B illustrates a cross section in the word line direction. The effect is almost the same as in FIG. 17, and the difference is that a gate electrode in contact with a tunnel film becomes elongated in the word line direction, so that it is possible to reduce the capacitance of the tunnel film and improve the coupling ratio.

FIGS. 19A and 19B illustrate a memory structure which is applicable to a NAND flash memory or other flash memories according to the ninth embodiment of the present embodiments. FIG. 19A illustrates a cross section in the bit line direction, and FIG. 19B illustrates a cross section in the word line direction. The effect is almost the same as in FIG. 18, and the difference is that a floating gate has a perfect pyramid shape of a trapezoidal shape both in the word line direction and the bit line direction. It is possible to further reduce an area of the tunnel film in contact with the floating gate, and improve the coupling ratio.

FIGS. 20A and 20B illustrate a memory structure which is applicable to a NAND flash memory or other flash memories according to the tenth embodiment of the present embodiments. FIG. 20A illustrates a cross section in the bit line direction, and FIG. 20B illustrates a cross section in the word line direction. The effect is the almost same as in FIG. 19, and the difference is that the width of the upper portion of the word line is much thicker, so that it is possible to reduce delay of word lines.

The embodiments of the present application are by no means limited to the above embodiments, and can be variously modified without deviation from the spirit of the embodiments at the stage of implementation. Further, the above embodiments include embodiments of various stages, and various embodiments can be extracted based on an adequate combination of a plurality of components to be disclosed. For example, even though some components are removed from all components disclosed in the embodiments, it is possible to solve the problems described in the summary and, when it is possible to obtain an effect described in the effects of the embodiments, it is possible to extract a configuration from which these components are removed as an embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory comprising:
   a substrate; and
   a plurality of cell blocks aligned on the substrate, each of the cell blocks including a plurality of first non-volatile memory cells connected in series, connecting a first end of a series of the first non-volatile memory cells to a bit line through a first selection transistor, and connecting a second end of the series of the first non-volatile memory cells to a source line through a second selection transistor,
   each of the plurality of first non-volatile memory cells comprising a first non-volatile memory cell comprising a first insulating film formed on a first silicon channel, a plurality of floating gates including a first floating gate formed on the first insulating film, a second insulating film formed on the first floating gate, a first gate electrode formed on the second insulating film, a first source layer and a first drain layer formed to sandwich the first silicon channel; and
   the first or the second selection transistor comprising a third insulating film formed on a second silicon channel, a second floating gate formed on the third insulating film, a fourth insulating film formed on the second floating gate, a second gate electrode formed on the fourth insulating film, a first contact to connect the second floating gate to a third gate electrode, a second source layer and a second drain layer formed to sandwich the second silicon channel, wherein an area S1 of the first insulating film at which the first floating gate is in contact with the first silicon channel is larger than an area S2 of the second insulating film at which the first floating gate is in contact with the first gate electrode, an air gap is provided between adjacent ones of the first non-volatile memory cells, and the air gap is vacuumed or injected with gas, and a capacitance ratio of a first capacitance between an adjacent pair of floating gates from the plurality of floating gates compared to a second capacitance between the first gate electrode and the first floating gate is 30% or less.

2. The memory according to claim 1, wherein
a thickness T1 of the first insulating film at which the first floating gate and the first silicon channel are in contact is thicker than a thickness T2 of the second insulating film at which the first floating gate and the first gate electrode are in contact.

3. The memory according to claim 2, wherein
data is programmed by decreasing a threshold voltage of a non-volatile memory cell,
wherein the threshold voltage is decreased by increasing a potential of the first gate electrode higher than the first source layer and the first drain layer to increase a quantity of electrons flowing from the first floating gate to the first gate electrode greater than a quantity of electrons flowing from the first silicon channel to the first floating gate.

4. The memory according to claim 3, wherein
data is erased by increasing a threshold voltage of the non-volatile memory cell,
wherein the threshold voltage is increased by decreasing a potential of the first gate electrode lower than the source layer and the first drain layer to increase the quantity of electrons flowing from the first gate electrode to the first floating gate higher than the quantity of electrons flowing from the first floating gate to the first silicon channel.

5. The memory according to claim 4, wherein
a first boundary surface between the first floating gate and the second insulating film and a second boundary surface between the first gate electrode and the second insulating film are parallel to a third boundary surface between the first silicon channel and the first insulating film.

6. The memory according to claim 5, wherein
the threshold voltage is grouped into two types, four types, eight types or sixteen types to allow one-bit, two-bit, three-bit or four-bit information to be stored.

7. The memory according to claim 1, wherein
a first air gap is provided between the adjacent ones of the non-volatile memories which are formed along a bit line direction, and
a second air gap is between the adjacent ones of the non-volatile memories which are formed along a word line direction.

8. The memory according to claim 1, wherein
the first floating gate along a bit line direction comprises a lower conductive layer comprising a first width, and an upper conductive layer comprising a second width narrower than the first width, and
the lower conductive layer is in contact with a lower surface of the second insulating film.

9. The memory according to claim 8, wherein
the first gate electrode along a bit line direction comprises an upper electrode comprising a first width and a lower electrode comprising a second width narrower than the first width, and
the lower electrode is in contact with an upper surface of the second insulating film.

10. A non-volatile memory comprising:
a first non-volatile memory cell comprising a plurality of floating gates including a first floating gate, a first insulating film formed on a first silicon channel, the first floating gate formed on the first insulating film, a second insulating film formed on the first floating gate, a first gate electrode formed on the second insulating film, a first source layer and a first drain layer formed to sandwich the first silicon channel,
wherein a shape of the first floating gate is a trapezoidal shape in which an upper side is shorter than a lower side,
an air gap is provided on both sides of the first non-volatile memory cell, and the air gap is vacuumed or injected with gas, and
a capacitance ratio of a first capacitance between an adjacent pair of floating gates from the plurality of floating gates compared to a second capacitance between the first gate electrode and the first floating gate is 30% or less.

11. The memory according to claim 10, wherein
a thickness T1 of the first insulating film sandwiched by the first floating gate and the first silicon channel is thicker than a thickness T2 of the second insulating film sandwiched by the first floating gate and the first gate electrode.

12. The memory according to claim 11, wherein
data is programmed by decreasing a threshold voltage of the non-volatile memory cell,
wherein the threshold voltage is decreased by increasing a potential of the first gate electrode higher than the first source layer and the first drain layer to increase a quantity of electrons flowing from the first floating gate to the first gate electrode greater than a quantity of electrons flowing from the first silicon channel to the first floating gate.

13. The memory according to claim 12, wherein
data is erased by increasing a threshold voltage of the non-volatile memory cell,
wherein the threshold voltage is increased by decreasing a potential of the first gate electrode lower than the first source layer and the first drain layer to increase the quantity of electrons flowing from the first gate electrode to the first floating gate greater than the quantity of electrons flowing from the first floating gate to the first silicon channel.

14. The memory according to claim 13, wherein
a first boundary surface between the first floating gate and the second insulating film and a second boundary surface between the first gate electrode and the second insulating film are parallel to a third boundary surface between the first silicon channel and the first insulating film.

15. The memory according to claim 14, wherein
the threshold voltage is grouped into two types, four types, eight types or sixteen types to allow one-bit, two-bit, three-bit or four-bit information to be stored.

16. The memory according to claim 10, wherein
a first air gap is provided between adjacent ones of the non-volatile memories which are formed along a bit line direction and,
a second air gap is between adjacent ones of the non-volatile memories which are formed along a word line direction.

17. The memory according to claim 10, wherein
the first floating gate along a bit line direction comprises a lower conductive layer comprising a first width, and an upper conductive layer comprising a second width narrower than the first width, and
the lower conductive layer is in contact with a lower surface of the second insulating film.

18. The memory according to claim 17, wherein
the first gate electrode along a bit line direction comprises an upper electrode comprising a first width and a lower electrode comprising a second width narrower than the first width,
the lower electrode is in contact with an upper surface of the second insulating film, and
an air gap is provided between adjacent ones of the first non-volatile memory cells.

* * * * *